United States Patent [19]

Takiguchi et al.

[11] Patent Number: 5,991,322
[45] Date of Patent: Nov. 23, 1999

[54] SEMICONDUCTOR OPTICAL DEVICE

[75] Inventors: Tohru Takiguchi; Katsuhiko Goto; Hirotaka Kizuki, all of Itami, Japan

[73] Assignee: Mitsubishi Denki Kabushiki Kaisha, Tokyo, Japan

[21] Appl. No.: 08/505,761

[22] Filed: Jul. 21, 1995

Related U.S. Application Data

[63] Continuation of application No. 08/260,368, Jun. 14, 1994, Pat. No. 5,459,747.

[30] Foreign Application Priority Data

Jul. 20, 1993 [JP] Japan .................................. 5-179313

[51] Int. Cl.$^6$ ....................................................... H01S 3/19
[52] U.S. Cl. ................................................ 372/50; 438/40
[58] Field of Search ................................ 372/50, 45, 46, 372/96; 438/22, 39–41

[56] References Cited

U.S. PATENT DOCUMENTS

| | | | |
|---|---|---|---|
| 4,843,032 | 6/1989 | Tokuda et al. | 437/129 |
| 4,961,198 | 10/1990 | Ishino et al. | 372/50 |
| 4,980,895 | 12/1990 | Nishimura | 372/96 |
| 5,019,519 | 5/1991 | Tanaka et al. | 437/22 |
| 5,042,049 | 8/1991 | Ohtoshi et al. | 372/45 |
| 5,084,897 | 1/1992 | Numai | 372/96 |
| 5,155,736 | 10/1992 | Ono et al. | 372/20 |
| 5,177,758 | 1/1993 | Oka et al. | 372/50 |
| 5,208,822 | 5/1993 | Haus et al. | 372/50 |
| 5,305,343 | 4/1994 | Allovon et al. | 372/50 |
| 5,325,382 | 6/1994 | Emura et al. | 372/26 |
| 5,341,391 | 8/1994 | Ishimura | 372/46 |
| 5,717,710 | 2/1998 | Miyazaki et al. | 372/50 |

FOREIGN PATENT DOCUMENTS

| | | |
|---|---|---|
| 0406005 | 1/1991 | European Pat. Off. . |
| 0472221 | 2/1992 | European Pat. Off. . |
| 0513745 | 11/1992 | European Pat. Off. . |
| 62-2299990 | 10/1987 | Japan . |
| 63-213383 | 9/1988 | Japan . |
| 64-17487 | 1/1989 | Japan . |
| 2288283 | 11/1990 | Japan . |
| 31473836 | 6/1991 | Japan . |
| 3222387 | 10/1991 | Japan . |
| 4100291 | 4/1992 | Japan . |
| 529602 | 2/1993 | Japan . |
| 5114767 | 5/1993 | Japan . |

OTHER PUBLICATIONS

Yablonovitch et al, "Band Structure Engineering Of Semiconductor Lasers For Optical Communications", Journal of Lightwave Technology, vol. 6, No. 8, 1988, pp. 1292–1299 Aug.

(List continued on next page.)

Primary Examiner—Rodney Bovernick
Assistant Examiner—Ellen E. Kang
Attorney, Agent, or Firm—Leydig, Voit & Mayer

[57] ABSTRACT

A semiconductor optical device includes a first semiconductor layer, and a diffraction grating disposed on the first semiconductor layer. The diffraction grating includes portions of a superlattice layer grown on the first semiconductor layer and including alternatingly arranged second semiconductor layers of a semiconductor material in which mass transport hardly occurs during growth of other semiconductor layers and third semiconductor layers of a semiconductor material different from the material of the second semiconductor layers. The device includes a fourth semiconductor layer burying the diffraction grating. In this structure, since the second semiconductor layers are included in the diffraction grating, the shape of the diffraction grating is maintained during the vapor phase deposition of the fourth semiconductor layer. Therefore, the thickness, amplitude, and pitch of the diffraction grating that determine the optical coupling constant are controlled with high precision.

5 Claims, 31 Drawing Sheets

OTHER PUBLICATIONS

Tanaka et al, "5–GB/s Performance Of Integrated Light Source Consisting of λ/4–Shifted DFB Laser And EA Modulator With Si InP BH Structure", Journal Of Lightwave Technology, vol. 8, No. 9, 1990, pp. 1357–1359 Sep.

Numai et al, "DFB LD/Modulator Integrated Light Source Using An Absorption Layer As A Guide Layer", 1990 Spring National Convention Record, The Institute of Electronics, Information and Communication Engineers, pp. 6 and 4–295.

Colas et al, "In situ Definition Of Semiconductor Structures By Selective Area Growth And Etching", Applied Physics Letters, vol. 59, No. 16, 1991, pp. 2019–2021 Oct.

Aoki et al, Novel Structure MOW Electroabsorption Modulator/DFB–Laser Integrated Device Fabricated By Selective Area MOCVD Growth, Electronics Letters, vol. 27, No. 23, 1991, pp. 2138–2140.

Kato et al, "DFB–LD/Modulator Integrated Light Source By Bandgap Energy Controlled Selective MOVPE", Electronics Letters, vol. 28, No. 2, pp. 153–154 Jan, 1992.

Aoki et al., "InGaAs/InGaAsP MOW Electroabsorption Modulator Integrated With A DFB Laser Fabricated By Band–Gap Energy Control Selective Area MOCVD", IEEE Journal of Quantum Electronics, vol. 29, No. 6, 1993, pp. 2088–2096.

Sasaki et al., "Selective MOVPE Growth And Its Application To Semiconductor Photonic Integrated Circuits", Electronics and Communication in Japan, Part II: Electronics, vol. 76, No. 4, 1993, pp. 1–11 Apr.

Remiens et al., "Buried Ridge Stripe Lasers Monolithically Integrated With Butt–Coupled Passive Waveguides For OEIC", SPIE vol. 1362, 1990, pp. 323–329 No month.

Colas et al., "In Situ Definition Of Semiconductor Structures By Selective Area Growth And Etching", Applied Physics Letters, vol. 59, No. 16, 1991, Oct. pp. 2019–2021.

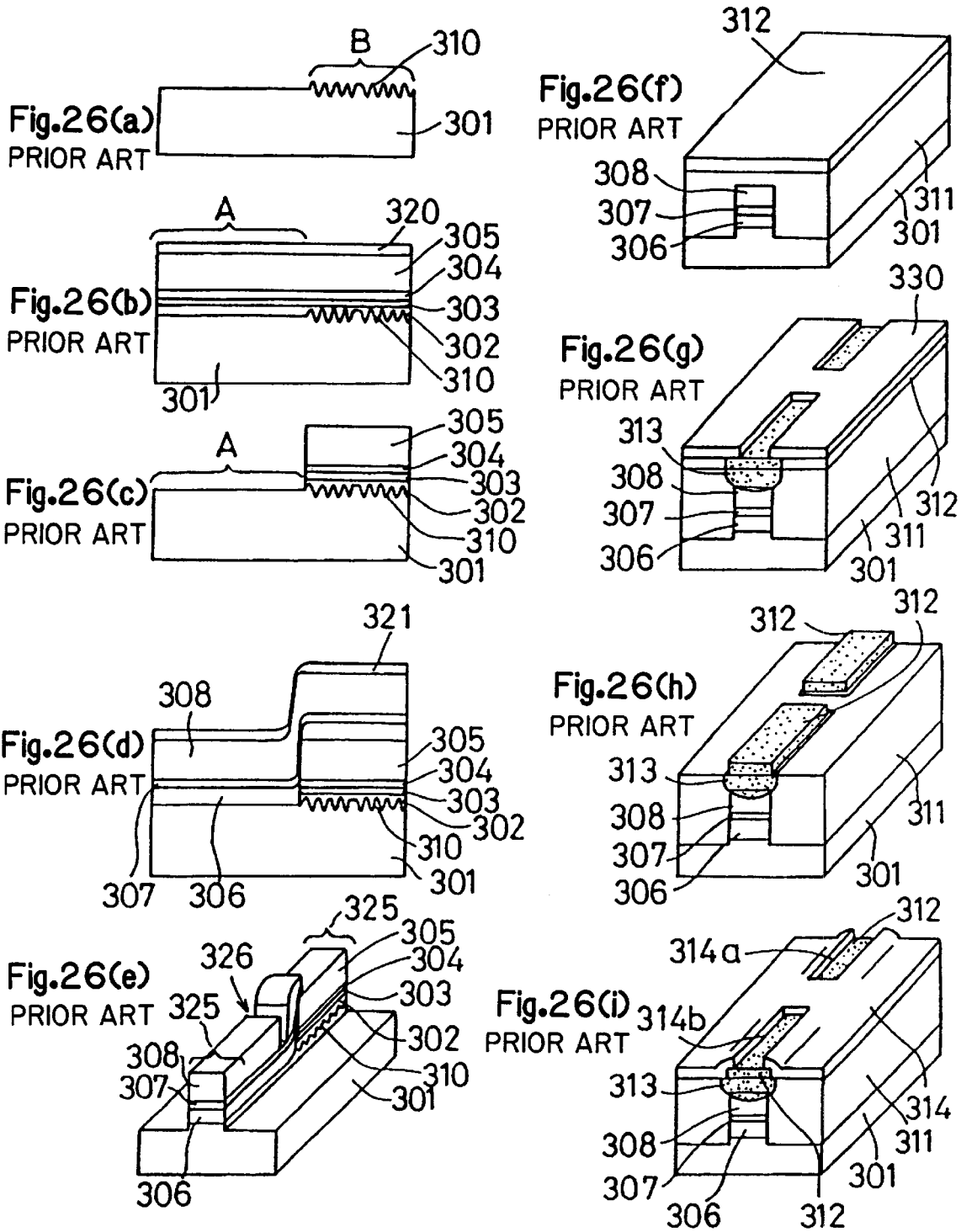

SEMICONDUCTOR OPTICAL DEVICE

This disclosure is a continuation of patent application Ser. No. 08/260,368, now patented with a U.S. Pat. No. 5,459,747, filed Jun. 14, 1994.

FIELD OF THE INVENTION

The present invention relates to semiconductor optical devices and, more particularly, to a semiconductor laser device including a diffraction grating in highly-controlled shape, an integrated semiconductor laser and high-speed light modulator that is used as a light source for fiber optic communication, and a wavelength variable distributed Bragg-reflector laser diode. The invention also relates to methods for fabricating these optical devices.

BACKGROUND OF THE INVENTION

FIG. 23 is a sectional view illustrating a distributed feedback (hereinafter referred to as DFB) semiconductor laser disclosed in, for example, Japanese Published Patent Application No. Sho. 62-45834. In the figure, reference numeral 201 designates an n type InP substrate. An n type InP lower cladding layer 202 is disposed on the substrate 201. An n type InGaAsP active layer 203 is disposed on the lower cladding layer 202. A p type InP first upper cladding layer 204a is disposed on the active layer 203. A diffraction grating comprising a periodic pattern of stripe-shaped p type InGaAsP layers 205a is disposed on the first upper cladding layer 204a. A p type InP second upper cladding layer 204b is disposed on the diffraction grating 205a and on the first upper cladding layer 204a. A p⁺ type InGaAsP contact layer 206 is disposed on the second upper cladding layer 204b. The double-heterojunction structure comprising the active layer 203, the lower cladding layer 202, and the upper cladding layers 204a and 204b is formed in a narrow stripe-shaped mesa. An n type InP mesa embedding layer 209 is disposed on the substrate 1, contacting opposite sides of the stripe-shaped mesa. A p type InP current blocking layer 210 and an n type InP current blocking layer 211 are successively disposed on the mesa embedding layer 209 at the opposite sides of the mesa. An insulating film 212 including a window opposite the stripe-shaped mesa is disposed on the top and side surfaces of the laser structure. A p side electrode 207 is disposed on the insulating film 212, contacting the InGaAsP contact layer 206 through the window in that insulating film 212. An n side electrode 208 is disposed on the rear surface of the substrate 201.

A description is given of the operation. In the prior art DFB laser, when a forward bias is applied across the p side electrode 207 and the n side electrode 208, holes and electrons are injected into the active layer 203 from the p side electrode 207 and the n side electrode 208, respectively, and these holes and electrons recombine to produce light. In this laser, the active layer 203 and the diffraction grating 205a which have relatively large refractive indices are interposed between the n type InP lower cladding layer 202, the p type InP first upper cladding layer 204a, and the p type InP second upper cladding layer 204b which have relatively small refractive indices, whereby a waveguide is produced. Therefore, the generated light travels through the active layer 203 and the diffraction grating 205a in the direction parallel to the active layer.

Further, since the stripe-shaped portions of the diffraction grating 205a are periodically present in the p type InP upper cladding layer, the effective refractive index is periodically changed in the array direction of the stripe-shaped portions of the diffraction grating 205a. If the array pitch of the diffraction grating 205a coincides with the period at which the generated light is subjected to Bragg reflection, only light having a wavelength that satisfies the condition of Bragg reflection is reflected in the waveguide, resulting in laser oscillation.

Process steps for fabricating the laser structure of FIG. 23 are illustrated in FIGS. 24(a)–24(d).

Initially, as shown in FIG. 24(a), there are successively grown on the n type InP substrate 201 an n type InP lower cladding layer 202, an n type InGaAsP active layer 203, a p type InP first upper cladding layer 204, and a p type InGaAsP layer 205, preferably by MOCVD.

A prescribed pattern is formed on the p type InGaAsP layer 205 using the two-luminous-flux interference exposure method and, thereafter, the p type InGaAsP layer 205 is selectively etched by chemical etching or the like until the etching front reaches the first upper cladding layer 204a, whereby the p type InGaAsP layer 205 is divided into a plurality of stripe-shaped parallel ridges 205a, producing a diffraction grating (FIG. 24(b)).

Thereafter, a p type InP second upper cladding layer 204b is grown over the entire surface of the wafer by MOCVD to bury the diffraction grating 205a (FIG. 24(c)).

Thereafter, the laser structure is formed in a stripe-shaped mesa by etching. Then, an n type InP layer 209, a p type InP current blocking layer 210, and an n type InP current blocking layer 211 are successively grown on the substrate 201 at opposite sides of the mesa. Thereafter, a contact layer 206 is formed on the entire surface of the wafer.

To complete the laser structure of FIG. 23, a p side electrode 207 and an n side electrode 208 are produced on the contact layer 206 and the rear surface of the substrate 201, respectively.

In the prior art DFB laser shown in FIG. 23, however, when the n type InP cladding layer 204b is grown on the diffraction grating 205a, the diffraction grating gets out of shape due to mass transport, whereby the thickness and amplitude of the diffraction grating are reduced, resulting in difficulty in controlling the coupling constant that affects the intensity of the distributed feedback applied to light.

FIG. 25(a) is a perspective view, partially in section, illustrating an integrated semiconductor laser and light modulator disclosed in, for example, Journal of Lightwave Technology, Vol.8, No.9, 1990, pp. 1357~1362. FIG. 25(b) is a sectional view of a part of the structure of FIG. 25(a) along the resonator length direction of the semiconductor laser.

In these figures, reference numeral 301 designates an n type InP substrate with a (100) surface orientation. A light modulator 300a and a laser diode (hereinafter referred to as LD) 300b are integrated on the n type InP substrate 301. The LD 300b includes a diffraction grating 310, an n type InGaAsP light guide layer 302, an undoped InGaAsP active layer 303, an undoped InGaAsP buffer layer 304, and a p type InP layer 305. The light modulator 300a includes an undoped InGaAsP light absorption layer 306, an undoped InGaAsP buffer layer 307, and a p type InP cladding layer 308. An Fe-doped current blocking layer 311 is disposed on the p type InP cladding layer 308 and the undoped InGaAsP buffer layer 307 of the light modulator 300a and on the p type InP layer 305 of the LD 300b. An InGaAs contact layer 312 is disposed on the current blocking layer 311. Reference numeral 313 designates a p type dopant diffused region, and numeral 314 designates an SiN insulating film. Reference numerals 315 and 316 designate p side electrodes of the modulator and the LD, respectively, and numeral 317 designates an n side electrode common to the modulator and the LD.

Process steps for fabricating the optical device of FIGS. 25(a)–25(b) are illustrated in FIGS. 26(a)–26(i).

Initially, as illustrated in FIG. 26(a), a λ/4-shifted diffraction grating 310 with 240 nm pitch is formed on a prescribed region of the (100) surface of the n type InP substrate 301 where a laser diode is to be located (region B in the figure).

In the step of FIG. 26(b), an n type InGaAsP light guide layer 302 (λ (wavelength)=1.3 μm, 0.1 μm thick), an undoped InGaAsP active layer 303 (λ=1.57 μm, 0.1 μm thick), an undoped InGaAsP buffer layer 304 (λ=1.3 μm, 0.1 μm thick), and a p type InP layer 305 about 1 μm thick are successively grown on the (100) surface of the n type InP substrate 301 by liquid phase epitaxy (LPE). Thereafter, a photoresist film 320 is deposited on the p type InP layer 305, and a portion of the resist film 320 in a region where a light modulator is to be located (region A in the figure) is selectively removed using conventional photolithographic techniques.

In the step of FIG. 26(c), using the photoresist pattern as a mask, the p type InP layer 305, the undoped InGaAsP buffer layer 304, the undoped InGaAsP active layer 303, and the n type InGaAsP light guide layer 302 are selectively dry-etched to expose the surface of the substrate 301 in the modulator region A.

In the step of FIG. 26(d), an undoped InGaAsP light absorption layer 306 having a band gap energy corresponding to a wavelength (λ) of 1.44 μm and a thickness of 0.3~0.5 μm, an undoped InGaAsP buffer layer 307 having a wavelength of 1.25 μm and a thickness of 0.1~0.3 μm, and a p type InP cladding layer 308 about 3 μm thick are successively grown by hydride vapor phase epitaxy (VPE). Thereafter, a photoresist film 321 is deposited on the p type InP cladding layer 308 and patterned in a stripe shape extending in what becomes the light guide direction of the LD, using conventional photolithographic techniques.

In the step of FIG. 26(e), using the photoresist pattern as a mask, those epitaxial layers on the substrate 301 are selectively dry-etched to form a stripe-shaped mesa 325 having a width of 2 μm. Thereafter, portions of the undoped InGaAsP light absorption layer 306, the undoped InGaAsP buffer layer 307, and the p type InP cladding layer 308 in the LD region are etched away. Also, a portion of the p type InP cladding layer 308 in the modulator region is etched away near the boundary between the modulator region and the LD region, forming a groove for electrical isolation 326.

In the step of FIG. 26(f), a high resistivity Fe-doped InP current blocking layer 311 is grown on the substrate 301 at opposite sides of the stripe-shaped mesa 325 and in the isolation groove 326 by VPE. Subsequently, an undoped InGaAs contact layer 312 is grown on the current blocking layer 311 by VPE.

In the step of FIG. 26(g), a dielectric film 330 is deposited over the contact layer 312, and stripe-shaped openings are formed in the dielectric film 330 opposite the modulator region and the LD region. Using this dielectric film as a mask, Zn is selectively diffused into the Fe-doped InP current blocking layer 311 and the undoped InGaAs contact layer 312 until the diffusion front reaches the stripe-shaped mesa 325, forming p type dopant diffused regions 313.

Thereafter, the InGaAs contact layer 312 is selectively etched leaving stripe-shaped portions opposite the modulator region and the laser region (FIG. 26(h)).

Then, an SiN film 314 is deposited on the stripe-shaped InGaAs contact layers 312 and on the Fe-doped InP layer 311, and openings 314a and 314b are formed in the SiN film 314 using conventional photolithography and etching techniques as shown in FIG. 26(i).

Finally, a p side electrode metal layer is deposited over the SiN film 314 contacting the contact layer 312 exposed in the openings 314a and 314b and, thereafter, the metal layer is patterned to form a p side electrode 315 for the light modulator and a p side electrode 316 for the laser diode. Further, a common n side electrode 317 is formed on the rear surface of the substrate 301, completing the optical device shown in FIG. 25 in which the semiconductor laser 300b and the light modulator 300a are monolithically integrated on the same substrate.

A description is given of the operation. In this optical device, since the band gap energy of the undoped InGaAsP light absorption layer 306 of the modulator 300a is larger than the band gap energy of the active layer 303 of the semiconductor laser 300b, light produced in the active layer 303 in the stripe-shaped mesa travels toward the undoped InGaAsP light absorption layer 306 of the light modulator 300a, and laser light is emitted from the cleaved facet of the light absorption layer 306. In this state, when no bias voltage is applied across the light modulator 300a, light traveling toward the front facet passes through the light absorption layer 306 and is emitted from the cleaved facet of the light absorption layer 306. Since the band gap energy of the light absorption layer 306 is larger than the band gap energy of the active layer 303 as described above, the laser light traveling through the modulator region is not absorbed by the light absorption layer 306. On the other hand, when a reverse bias is applied across the light modulator 300a with the n side electrode 317 on the plus side and the p side electrode 315 on the minus side, an electric field is applied to the light absorption layer 306, and the effective band gap energy of the light absorption layer 306 is reduced due to Franz-Keldysh effect as shown in FIG. 29, whereby the traveling laser light is absorbed by the light absorption layer 306, i.e., it is not emitted from the facet. In this way, the laser output is controlled by applying a reverse bias to the light modulator.

In the integrated semiconductor laser and light modulator shown in FIG. 25, the light absorption layer 306 of the modulator 300a and the active layer 303 of the LD 300b are different semiconductor layers having different refractive indices grown in different epitaxial growth steps. In addition, when the epitaxial layers 306, 307, and 308 of the light modulator 300a are grown, the thicknesses of these layers unfavorably increase in the vicinity of the boundary between the light modulator and the LD. Therefore, the absorption layer 306 of the light modulator is not smoothly connected to the active layer 303 and the light guide layer 302 of the LD, whereby reflection and scattering occur at the contact part, adversely affecting the efficiency of the optical coupling between the light modulator and the LD.

When selective growth is carried out using an insulating film as a mask, i.e., when a wafer is partially masked with an insulating film and crystal growth is carried out selectively on part of the wafer where the insulating film is absent, the thickness of the grown layer is increased in the vicinity of the boundary between the unmasked part and the masked part, i.e., so-called edge growth occurs. Such edge growth also occurs when crystal growth is carried out on a wafer having a step, i.e., difference in level, as shown in FIG. 26(d). That is, in FIG. 26(d), the thicknesses of the layers 306, 307, and 308 grown on the lower region of the wafer, i.e., the light modulator region A, increase in the vicinity of the step.

The optical coupling efficiency is significantly affected by the edge growth. The edge growth caused by the step of the wafer increases with an increase in the height of the step. In this prior art, structure the height of the step of the wafer is equal to the total of the thicknesses of the light guide layer 302, the active layer 303, the undoped InGaAsP buffer layer 304, and the p type InP layer 305, i.e., 1.3 μm or more, so that considerable large edge growth occurs.

Not only the reduction in the optical coupling efficiency but also an uneven surface after the crystal growth, which adversely affects processing after the crystal growth, such as the formation of the ridge structure.

FIG. 27 is a sectional view schematically illustrating an integrated semiconductor laser and light modulator disclosed in "Institute of Electronics, Information and Communication Engineers, 1990 Spring National Convention Record, C-20, p.4–295". In FIG. 27, reference numeral 401 designates an n type InP substrate. A light modulator 400a and a laser diode 400b are integrated on the n type InP substrate 401. The substrate 401 includes a diffraction grating 410 in a region where the LD 400b is located. An n type InGaAsP light absorption and light guide layer 402 is disposed on the substrate 401 including the diffraction grating 410. An undoped InGaAsP active layer 403 is disposed on the n type InGaAsP layer 402 in the LD region. A p type InP layer 404 is disposed on the active layer 403. A p type InP cladding layer 405 is disposed on the n type InGaAsP layer 402 and on the p type InP layer 404. P type InGaAsP contact layers 406a and 406b are disposed on the cladding layer 405 in the modulator region and the LD region, respectively. A p side electrode 407 of the modulator is disposed on the contact layer 406a and a p side electrode 408 of the LD is disposed on the contact layer 406b. An n side electrode 409 common to the modulator and the LD is disposed on the rear surface of the substrate 401.

Process steps for fabricating this optical device are illustrated in FIGS. 28(a)–28(c).

Initially, a diffraction grating 410 is formed on a part of the substrate 401. Then, a light absorption and light guide layer 402 about 0.3 μm thick, an active layer 403 about 0.15 μm thick, and a p type InP layer 404 about 0.1 μm thick are successively grown on the substrate by MOCVD (FIG. 28(a)). Thereafter, portions of the p type InP layer 404 and the active layer 403 in a region where the diffraction grating 410 is absent, i.e., the modulator region, are selectively etched away (FIG. 28(b)). Thereafter, a p type InP cladding layer 405 and a p type InGaAsP contact layer 406 are grown over the wafer (FIG. 28(c)).

A description is given of the operation. The operating principle of this optical device is identical to that of the optical device shown in FIG. 25. That is, when a forward bias is applied across the laser diode 400b with the p side electrode 408 on the plus side, carriers are injected into the active layer 403 and laser oscillation occurs. In this state, when no bias voltage is applied across the light modulator 400a, laser light traveling toward the front facet passes through the light guide and absorption layer 402 and is emitted from the facet of the layer 402. Since the band gap energy of the light guide and absorption layer 402 is larger than the band gap energy of the active layer 403, the laser light traveling through the light modulator region is not absorbed by the light guide and absorption layer 402. On the other hand, when a reverse bias is applied across the light modulator 400a with the n side electrode 409 on the plus side and the p side electrode 407 on the minus side, an electric field is applied to the light guide and absorption layer 402, and the effective band gap energy of the light absorption layer is reduced due to Franz-Keldysh effect as shown in FIG. 29, whereby the traveling laser light is absorbed by the light absorption layer, i.e., it is not emitted from the facet. In this way, the laser output is controlled by applying a reverse bias to the light modulator.

In the prior art optical device shown in FIG. 27, since the n type InGaAsP layer 402 serves both as a light absorption layer of the modulator and a light guide layer of the LD, the unwanted reduction in the efficiency of the optical coupling between the light modulator and the LD and the uneven surface of the wafer, which are seen in the optical device of FIG. 25, are avoided.

However, the optical device shown in FIG. 27 including the n type InGaAsP layer 402 serving both as a light absorption layer of the modulator and a light guide layer of the LD has the following drawbacks.

A light absorption layer of a light modulator must be depleted when the modulator is reversely biased. In addition, it must be a low carrier concentration layer (undoped layer) to avoid breakdown. Therefore, if the InGaAsP light absorption and light guide layer 402 satisfies the above-described conditions for the light absorption layer, a portion of the layer 402 serving as a light guide layer of the LD also has a low carrier concentration. The resistance of the LD increases by several ohms at the light guide layer, whereby the operating voltage of the LD is unfavorably increased.

Further, the band gap energy of the light absorption layer is about 0.05 eV higher than the band gap energy of the active layer of the LD. The reason is as follows. In order to modulate light, the light modulator must provide a band gap energy of the light absorption layer smaller than the band gap energy of the active layer by the band gap reduction effect achieved when a reverse bias is applied. Therefore, the difference in band gap energies between the light absorption layer and the active layer should not exceed 0.05 eV corresponding to the reduced amount of the band gap energy. As shown in FIG. 29, the absorption coefficient of the light absorption layer decreases as the wavelength of the light increases. However, since the decrease of the absorption coefficient is relatively gentle, even when light produced in the LD has a wavelength of 1.55 μm (band gap energy: 0.8 eV) and no bias is applied to the modulator, the light is partly absorbed by the InGaAsP light absorption layer having a band gap energy of about 0.85 eV (wavelength: 1.46 μm). Therefore, an absorption loss of some degree is inevitable in the light guide layer of the LD that also serves as the light absorption layer of the modulator. As a result, the threshold current of the LD is increased or the efficiency of the LD is reduced.

FIG. 30 is a perspective view of an integrated semiconductor laser and light modulator disclosed in Electronics Letters, 16th Jan. 1992, Vol.28, No. 2, pp.153–154. In the figure, reference numeral 501 designates an n type InP substrate. A light modulator 500a and a laser diode 500b are integrated on the substrate 501. The substrate 501 includes a diffraction grating 511 in a region where the LD 500b is located. There are successively disposed on the substrate 501, an n type InGaAsP guide layer 502, an n type InP spacer layer 503, an n type InP lower cladding layer 506, an intrinsic type (hereinafter referred to as i type) InGaAs/InGaAsP multi-quantum well (hereinafter referred to as MQW) layer 507, and a p type InP upper cladding layer 508. The lower cladding layer 506, the MQW layer 507, and the upper cladding layer 508 are formed in a stripe-shaped ridge. The top and opposite sides of the ridge are covered with a p type InP layer 509. A p$^+$ type InGaAsP contact layer 510 is disposed on the p type InP layer 509 at the top of the ridge. An SiO$_2$ insulating film 512 is disposed over the structure. A p side electrode 513a of the light modulator 500a and a p side electrode 513b of the LD 500b are disposed on the p$^+$ type InGaAsP contact layer 510. An n side electrode 514 common to the light modulator and the LD is disposed on the rear surface of the substrate 501.

Process steps for fabricating the optical device of FIG. 30 are illustrated n FIGS. 31(a)–31(c).

Initially, a diffraction grating 511 is formed on a part of the substrate 501 where a DFB-LD-is to be located. Then, an n type InGaAsP guide layer 502 and an n type InP spacer layer 503 are grown over the entire surface of the substrate 501 including the diffraction grating 511. Thereafter, a pair of SiO$_2$ films 520 with a 2 μm wide gap between them are formed on the spacer layer 503 (FIG. 31(a)). The width of the SiO$_2$ film 520 is about 10 μm in the DFB-LD region and about 4 μm in the modulator region.

In the step of FIG. 31(b), using the SiO$_2$ films 520 as masks, an n type InP cladding layer 506, an i type InGaAs/InGaAsP MQW layer 507, and a p type InP cladding layer 508 are selectively grown on the spacer layer 503 by MOCVD. The respective grown layers 506~508 are thicker in the region sandwiched by the wider (about 10 μm) portions of the SiO$_2$ films 520 than in the region sandwiched by the narrower (about 4 μm) portions of the SiO$_2$ films 520. This result is attributed to the fact that species reaching the SiO$_2$ masks 520 migrate to the unmasked region where the substrate is exposed and deposited on that region because no material deposition occurs on the SiO$_2$ masks.

Thereafter, each of the SiO$_2$ films 520 is etched by 1 μm from the inside of the stripe along its length to increase the gap between the SiO$_2$ films 520, and a p type InP layer 509 is selectively grown covering the MQW structure (FIG. 31(c)). Further, a p$^+$ type InGaAsP contact layer 510 is selectively grown on the p type InP layer 509.

Thereafter, a portion of the contact layer 510 at the boundary of the LD region and the modulator region is etched away to provide high electrical isolation. Finally, p side electrodes 513a and 513b are formed in the modulator region and the LD region, respectively, and an n side electrode 514 is formed on the rear surface of the substrate 501 to complete the integrated DFB-LD and light modulator shown in FIG. 30.

A description is given of the operation. As described above, the MQW layer 507 in the DFB-LD region is thicker than the MQW layer 507 in the modulator region. In a quantum well layer, the effective band gap energy (E$_g$) decreases as the thickness of the well layer increases. Accordingly, in the MQW layer 507, the band gap energy E$_{g1}$ of the DFB-LD is smaller than the band gap energy E$_{g2}$ of the modulator. When the DFB-LD is forward biased for continuous oscillation, since E$_{g2}$>E$_{g1}$, laser light (wavelength λ$_1$=1.24/E$_{g1}$) is not absorbed by the modulator, i.e., it is emitted from the facet. On the other hand, when a reverse bias is applied across the light modulator, the exciton wavelength absorption edge shifts toward the long wavelength side due to quantum confinement Stark effect of the MQW layer, and the effective band gap energy E$_{g'2}$ of the modulator is smaller than the band gap energy of the DFB-LD, i.e., E$_{g'2}$<E$_{g1}$, whereby laser light is absorbed by the light modulator and quenched. In this way, on and off switching of the laser light are controlled by varying the voltage applied to the light modulator.

In the prior art optical device shown in FIG. 30, however, the width of the upper portion of the stripe-shaped ridge fabricated between the SiO$_2$ masks 520 is only 2~3 μm, and patterning of the p side electrodes on such a narrow region is very difficult, resulting in poor reproducibility. Further, in the stripe-shaped ridge, as shown in the sectional view of FIG. 32 taken along the stripe direction of the ridge, the total of the thicknesses of the grown layers in the DFB-LD region is 1.5~2 times as thick as that in the modulator region, so that a step of 1~2 μm height is formed at the boundary between the LD region and the modulator region. This step adversely affects subsequent processing, such as formation of electrodes. In addition, since the MQW layer serving as a waveguide layer has a step, transmission loss of guided light is unfavorably increased. This unwanted increase in the transmission loss due to the step of the waveguide MQW layer also occurs in the prior art optical device shown in FIG. 33(c).

FIGS. 33(a)–33(c) are diagrams illustrating the structure and production process of an integrated semiconductor laser and light modulator, disclosed in Electronics Letters, 7th Nov. 1991, Vol. 27, No. 23, pp.2138–2140. In FIG. 33(b), reference characters A and B denote enlarged views of semiconductor layers in the modulator region and the laser region, respectively.

In these figures, reference numeral 601 designates an n type InP substrate. A light modulator 600a and a laser diode 600b are integrated on the substrate 601. The substrate 601 includes a diffraction grating 607 in the LD region. An n type InGaAsP guide layer 602 is disposed on the substrate 601 including the diffraction grating 607. An InGaAs/InGaAsP multiple quantum well (MQW) layer 603 is disposed on the guide layer 602. A p type InP cladding layer 605 is disposed on the MQW layer 603. P type InGaAsP cap layers 606 are disposed on the cladding layer 605 in the modulator region and the LD region, respectively. P side electrodes 608 and 609 of the light modulator 600a and the LD 600b, respectively, are disposed on the respective cap layers 606. An n side electrode 610 common to the light modulator 600a and the LD 600b is disposed on the rear surface of the substrate 601.

A description is given of the production process.

Initially, as illustrated in FIG. 33(a), a diffraction grating 607 is formed on a prescribed region of the InP substrate 601 where an LD is to be located, and a pair of stripe-shaped SiO$_2$ films 620 extending in what becomes the light guiding direction of the laser are formed on the InP substrate 601 at opposite sides of the diffraction grating 607. The size of each SiO$_2$ film 620 is about 200 μm×400 μm, and the space between the SiO$_2$ films 620, i.e.; the width of the region where the diffraction grating 607 is present, is about 200 μm. A light modulator will be formed on a region of the InP substrate 601 where the diffraction grating 607 and the SiO$_2$ films 620 are absent.

In the step of FIG. 33(b), an n type InGaAsP guide layer 602, an InGaAs/InGaAsP multiple quantum layer 603, and a p type InP cladding layer 605 are grown on the substrate 601 by MOCVD. During the MOCVD growth, since no semiconductor material is grown on the SiO$_2$ films 620, a large quantity of species formed in the growth process reach the LD region between the SiO$_2$ films. Therefore, the growing layers grow faster in the LD region than in the modulator region where the SiO$_2$ films are absent. Thus, the grown layers 602, 603, and 605 in the LD region are 1.5~2 times as thick as those in the modulator region. That is, as illustrated in FIGS. 33(b)A and 33(b)B, the well layer 631b included in the MQW layer 603 in the LD region is thicker than the well layer 631a included in the MQW layer 603 in the modulator region and, therefore, the band gap energy of the MQW layer in the modulator region is larger than that in the LD region.

Thereafter, a p type InGaAsP cap layer 606 is formed on the p type InP cladding layer 605, and a part of the cap layer 606 at the boundary between the LD region and the modulator region is etched away. Then, p side electrodes 608 and 609 are formed on the separated cap layers 606 in the modulator region and the LD region, respectively, and a common n side electrode 610 is formed on the rear surface of the substrate 601, completing the optical device shown in FIG. 33(c) in which a semiconductor laser 600a and a light modulator 600b are monolithically integrated on the same substrate.

A description is given of the operation. The InGaAs/InGaAsP MQW layer 603 serves as an active layer in the LD region and as a light absorption layer in the modulator region. When a forward bias is applied across the p side electrode 609 of the LD 600b and the common n side electrode 610, carriers are injected into the InGaAs/InGaAsP MQW layer 603, and laser oscillation occurs at a wavelength that is determined by the effective band gap energy of the MQW layer and the diffraction grating 607. The effective band gap energy of the MQW layer depends on the thickness of the well layer included in the MQW layer, that is, the effective band gap energy increases as the thickness of the well layer decreases. In the above-described selective growth using MOCVD, the well layer is thicker in the DFB-LD region than in the modulator region, so that the band gap energy $E_{g1}$ of the MQW layer in the DFB-LD region is smaller than the band gap energy $E_{g2}$ of the MQW layer in the modulator region. When no bias voltage is applied across the light modulator while the DFB-LD is forward biased to continuously oscillate, laser light (wavelength $\lambda 1=1.24/E_{g1}$) is not absorbed in the modulator region because $E_{g2}$ is larger than $E_{g1}$. The laser light is emitted from the facet. On the other hand, when a reverse bias is applied across the light modulator, the exciton absorption edge is shifted toward the long wavelength side due to the quantum confinement Stark effect of the MQW layer, and the effective band gap energy $E_{g'2}$ in the modulator region is smaller than the effective band gap energy $E_{g1}$ in the DFB-LD region, whereby laser light is absorbed by the light modulator and quenched. Therefore, on and off switching of the laser light are controlled by varying the voltage applied to the light modulator.

FIG. 34 is a sectional view illustrating an integrated semiconductor laser and light modulator disclosed in Japanese Published Patent Application No. Hei. 4-100291. In the figure, reference numeral 701 designates an n type InP substrate. A light modulator 700a and a laser diode 700b are integrated on the InP substrate 701. An n type InP buffer layer 704 is disposed on the InP substrate 701. An n type InGaAsP guide layer 705 is disposed on the buffer layer 704. An InGaAs/InGaAsP MQW layer 706 is disposed on the guide layer 705. A p type InGaAsP guide layer 707 is disposed on the MQW layer 706. The p type InGaAsP guide layer 707 includes a diffraction grating 708 in the LD region. A p type InP cladding layer 710 is disposed on the p type InGaAsP guide layer 707 including the diffraction grating 708. Two p$^+$ type InGaAsP cap layers 711 are respectively disposed on the cladding layer 710 in the modulator region and the LD region. P side electrodes 716a and 716b of the modulator 700a and the LD 700b, respectively, are disposed on the respective cap layers 711. An n side electrode 717 common to the light modulator and the LD is disposed on the rear surface of the substrate 701. Reference numeral 715 designates an SiO$_2$ insulating film.

FIGS. 35(a)–35(j) are diagrams illustrating process steps for fabricating the optical device of FIG. 34, in which FIGS. 35(a), 35(b), and 35(e) are perspective views, FIGS. 35(c), 35(d), 35(f), and 35(g) are sectional views taken along the resonator length direction, and FIGS. 35(h), 35(i), and 35(j) are sectional views perpendicular to the resonator length direction.

Initially, as illustrated in FIG. 35(a), a pair of SiO$_2$ films 720, each having a width of about 100 μm, are formed on a prescribed region of the substrate 701 where an LD is to be located. A stripe-shaped region 721 sandwiched by the SiO$_2$ films 720 is about 30 μm wide. A light modulator will be located in a region of the substrate 701 where the SiO$_2$ films 720 are absent.

In the step of FIG. 35(b), the substrate 701 is etched using the SiO$_2$ films 720 as masks. The etching rate of the substrate in the stripe-shaped region 721 sandwiched by the SiO$_2$ films 720 (LD region) is higher than the etching rate of the substrate in the other region (modulator region), so that the region 721 is etched deeper than the modulator region, resulting in a stripe-shaped groove 722. Thereafter, using the SiO$_2$ films 720 as masks for selective growth, an n type InP buffer layer 704, an n type InGaAsP guide layer 705, an InGaAs/InGaAsP multiple quantum well layer 706, and a p type InGaAsP guide layer 707 are successively grown on the substrate 701 by MOCVD (first MOCVD process). During the first MOCVD process, since species produced in the growth process are not deposited on the SiO$_2$ masks 720, a large quantity of the species reach the groove 722 between the SiO$_2$ masks, so that the growth rate in the groove 722 is higher than the growth rate on the other region, i.e., the modulator region. As a result, those grown layers 704 to 707 are thicker in the LD region than in the modulator region. The resulting structure after the first MOCVD process is shown in a sectional view in FIG. 35(c).

After removal of the SiO$_2$ films 720, a primary diffraction grating 708 having a pitch of 2400 Å is formed on the guide layer 707 in the LD region (FIG. 35(d)). Thereafter, a pair of SiO$_2$ films 723, each having a width of about 100 μm, are formed on the guide layer 707 in the modulator region. A stripe-shaped region sandwiched by the SiO$_2$ films 723, where the guide layer 707 is exposed, is about 30 μm wide. Then, a p type InP cladding layer 710 and a p$^+$ type InGaAsP cap layer 711 are successively grown over the wafer by MOCVD (second MOCVD process). These layers 710 and 711 are thicker in the region sandwiched by the SiO$_2$ masks 723 (the modulator region) than in the region where the SiO$_2$ masks 723 are absent (the LD region). The wafer, before the second MOCVD of process in which the cladding layer 710 and the cap layer 711 are grown, is thinner in the modulator region than in the LD region, and these layers 710 and 711 grown in the second MOCVD process are thicker in the modulator region than in the LD region, so that the thickness of the whole wafer after the second MOCVD process is uniform. The resulting structure is shown in a sectional view in FIG. 35(f).

As illustrated in FIG. 35(g), a part of the cap layer 711 at the boundary between the LD region and the modulator region is etched away. Thereafter, a stripe-shaped SiO$_2$ film 724 extending in what becomes the resonator length direction of the laser is formed on the wafer. Using the SiO$_2$ film 724 as a mask for selective etching, the respective semiconductor layers are etched in a mesa shape as shown in FIG. 35(h). Then, using the SiO$_2$ film 724 as a mask for selective growth, a high resistivity Fe-doped InP layer 725 is grown on the InP substrate 701 contacting the opposite sides of the mesa (FIG. 35(i)). After removal of the SiO$_2$ film 724, an SiO$_2$ insulating film 715 is deposited over the wafer and patterned to form two contact holes in the modulator region and the LD region, respectively. To complete the structure of FIG. 34, p side electrodes 716a and 716b are formed in the modulator region and the LD region, respectively, and a common n side electrode 717 is formed on the rear surface of the substrate 701. FIG. 35(j) is a sectional view of the completed device taken along a plane perpendicular to the resonator length direction.

The operating principle of the optical device shown in FIG. 34 fabricated according to the above-described process steps is identical to those of the optical devices shown in FIGS. 30 and 33(c). That is, in the structure of FIG. 34, the InGaAs/InGaAsP MQW layer 706 serves as an active layer in the-LD region and as a light absorption layer in the light modulator region. When a forward bias is applied across the p side electrode 716b of the LD 700b and the n side electrode 717, carriers are injected into the InGaAs/InGaAsP MQW layer 706, and laser oscillation occurs at a wavelength determined by the effective band gap energy of the MQW layer and the diffraction grating 708. The effective band gap energy of the MQW layer depends on the thickness of the well layer included in the MQW layer 706, i.e., the band gap energy increases as the thickness of the well layer decreases. In the above-described selective growth using MOCVD, the well layer is thicker in the LD region than in the modulator region, so that the effective band gap energy $E_{g1}$ of the MQW layer in the LD region is smaller than the effective band gap energy $E_{g2}$ of the MQW layer in the modulator region. When no bias is applied across the light modulator and the DFB-LD is forward biased to continuously oscillate, the laser light (wavelength $\lambda 1 = 1.24/E_{g1}$) is not absorbed in the modulator region because $E_{g2}$ is larger than $E_{g1}$. The laser light is emitted from the facet. On the other hand, when a reverse bias is applied across the light modulator, the exciton absorption edge is shifted toward the long wavelength side due to the quantum confinement Stark effect of the MQW layer, and the effective band gap energy $E_{g'2}$ in the modulator region is smaller than the effective band gap energy $E_{g1}$ in the LD region, whereby laser light is absorbed by the light modulator and quenched. Therefore, on and off switching of the laser light can be controlled by varying the voltage applied to the light modulator.

In the prior art optical devices shown in FIGS. 30, 33(a)–33(c), and 34, the MQW layer serves both as an active layer of the LD and a light absorption layer of the modulator, and the band gap energy of the MQW layer is varied by varying the thickness of the well layer included in the MQW layer. Therefore, an optimum design of the MQW structure for each of the active layer and the light absorption layer is impossible. For example, in a long wavelength quantum well LD, a quantum well active layer is desired to have about five well layers each having a thickness of 4–8 nm. When the total thickness of the quantum well layers is increased by increasing the number of the well layers or the thickness of each well layer, the light, confinement effect is encouraged too much, whereby an elliptic laser light beam, that is long in the direction perpendicular to the respective layers of the laser, is emitted. In this case, it is difficult to narrow the emitted laser light. On the other hand, in the light modulator, the quantum well light absorption layer is desired to have about 10 well layers each having a thickness of about 8 nm. If the well layer is too thick, the voltage required for shifting the absorption wavelength is increased. If the well layer is too thin, the shifting of the absorption wavelength is reduced. Further, if the number of the well layers included in the quantum well light absorption layer is too small, the light confinement-coefficient is reduced, and the extinction ratio is reduced.

As described above, the optimum design values for the quantum well active layer of the LD are different from those for the quantum well light absorption layer of the modulator. However, in the structure shown in FIG. 34, the well layer of the LD is inevitably 1.5~2 times as thick as the well layer of the light modulator. If the well layer of the LD takes the optimum thickness, the well layer of the modulator is much thinner than the optimum thickness. In this case, the shift of the absorption edge when the electric field is applied, which is in proportion to the biquadrate of the well layer thickness, is decreased or the light confinement coefficient in the well layer, which is in proportion to the well layer thickness, is reduced, resulting in insufficient light absorption that causes insufficient extinction characteristics.

On the contrary, if the well layer of the light modulator takes the optimum thickness, the well layer of the LD is too thick, so that improvement in LD characteristics due to the quantum well is not achieved. Further, since the thickness of the active layer is increased, the vertical mode of the light distribution does not take the fundamental mode.

Further, since the LD and the light modulator includes well layers of the same number, the degree of freedom in design is low, so that it is very difficult to solve the above-described problems. As a result, if characteristics of the LD are given priority, characteristics of the light modulator are sacrificed, and vice versa.

In the integrated semiconductor laser and light modulator shown in FIG. 34, the width of the SiO$_2$ film 720 used as a mask for selective growth is as wide as 100 μm, and the interval between the adjacent SiO$_2$ films 720 is only 30 μm, and polycrystalline material is unfavorably deposited on the SiO$_2$ films during the selective growth, which makes it difficult to remove the SiO$_2$ films after the selective growth. In addition, the thickness of the layer grown in the stripe-shaped groove 722 between the SiO$_2$ masks 720 varies in the width direction of the groove 722. That is, the grown layer is thicker in the vicinity of the SiO$_2$ masks 720 than in the center between the SiO$_2$ masks 720.

SUMMARY OF THE INVENTION

It is an object of the present invention to provide a distributed feedback semiconductor laser having a coupling constant equivalent to a design value.

It is another object of the present invention to provide an integrated semiconductor laser and light modulator that reduces the difference in level at the junction of the laser and the modulator to facilitate the fabrication process, and that reduces the absorption loss and the resistance of the laser diode.

It is still another object of the present invention to provide a method for fabricating a semiconductor optical device including relatively simple process steps for fabricating electrodes and the like, providing high reproducibility and good yield, and reducing the loss of light in a waveguide boundary region.

It is yet another object of the present invention to provide an integrated semiconductor laser and light modulator in which the laser and the light modulator are optimized individually and the optical coupling efficiency between the laser and the light modulator is improved.

Other objects and advantages of the present invention will become apparent from the detailed description that follows. The detailed description and specific embodiments described are provided only for illustration since various additions and modifications within the scope of the invention will be apparent to those of skill in the art from the detailed description.

According to a first aspect of the present invention, a semiconductor optical device includes a first semiconductor layer, a diffraction grating formed on the first semiconductor layer, which is made of portions of a superlattice layer comprising alternatingly arranged second semiconductor layers comprising a semiconductor material in which mass transport hardly occurs and third semiconductor layers comprising a semiconductor material different from the material of the second semiconductor layers, and a fourth semiconductor layer deposited on the diffraction grating by vapor phase deposition so that the diffraction grating is buried by the fourth semiconductor layer. In this structure, since the second semiconductor layers in which mass transport hardly occurs are included in the diffraction grating, the shape of the diffraction grating is maintained during the vapor phase deposition of the fourth semiconductor layer. Therefore, the thickness, amplitude, and pitch of the diffraction grating that determine the optical coupling constant are controlled with high precision.

According to a second aspect of the present invention, a semiconductor optical device in which a semiconductor laser diode and a light modulator for modulating laser light produced in the laser diode are integrated on a substrate, comprises a light absorption layer of the light modulator comprising a part of a semiconductor layer grown on the substrate, and a diffraction grating of the semiconductor laser diode comprising a plurality of stripe-shaped portions of semiconductor layer other than the part of the light absorption layer. Those stripe-shaped portions of the diffraction grating are periodically arranged parallel to each other and perpendicular to the light guiding layer of the laser diode. Therefore, an integrated semiconductor laser and light modulator having reduced absorption loss and resistance in the semiconductor laser diode region is achieved.

According to a third aspect of the present invention, in the above-described integrated semiconductor laser and light modulator, a portion of the semiconductor layer to be a light guide layer of the semiconductor laser is thinned by etching and then that portion is patterned into a diffraction grating. Therefore, the absorption loss and the resistance in the semiconductor laser region are further reduced.

According to a fourth aspect of the present invention, in a method for fabricating a semiconductor optical device, initially, a lower cladding layer of a first conductivity type, an active layer, and a first upper cladding layer of a second conductivity type, opposite the first conductivity type, are successively arranged on a first conductivity type semiconductor substrate. Then, portions of the first upper cladding layer and the active layer in a region where a light modulator is to be located are removed and, thereafter, a semiconductor layer having a band gap energy larger than that of the active layer is grown over the entire surface of the wafer. A portion of the semiconductor layer in a region where a laser diode is to be located is formed into a diffraction grating, i.e., the diffraction grating comprises a plurality of stripe-shaped portions of the semiconductor layer which are periodically arranged parallel to each other and perpendicular to what becomes the light guiding direction of the laser diode. Finally, a second conductivity type second upper cladding layer comprising a semiconductor material of the same composition as the first upper cladding layer is grown over the entire surface of the wafer so that the diffraction grating is embedded in the first and second upper cladding layers.

Therefore, an integrated semiconductor laser and light modulator having reduced absorption loss and resistance in the semiconductor laser diode region is fabricated.

According to a fifth aspect of the present invention, in the above-described method for fabricating a semiconductor optical device, before the formation of the diffraction grating, a portion of the semiconductor layer having a band gap energy smaller than that of the active layer in a region where a laser diode is to be located is thinned by etching. Therefore, the absorption loss and the resistance in the semiconductor laser diode region are further reduced.

According to a sixth aspect of the present invention, in a method for fabricating a semiconductor optical device in which a plurality of functional elements are integrated, initially, a semiconductor wafer comprising a semiconductor substrate and at least a current blocking layer grown on the substrate is prepared, and a pair of masks are formed on the wafer with a stripe-shaped region of the wafer exposed between the masks. Each mask has portions of different widths corresponding to the respective functional elements. Using the masks, the wafer is selectively etched by vapor phase etching to form a stripe-shaped groove penetrating through the current blocking layer. Then, using the masks, a cladding layer of a first conductivity type, a multiple quantum well layer, and a cladding layer of a second conductivity type, opposite the first conductivity type, are selectively grown in the stripe-shaped groove. After removal of the masks, a second conductivity type semiconductor layer is grown over the entire surface of the wafer so that the surface of the second conductivity type semiconductor layer is flat. The flat surface of the wafer after the crystal growth process facilitates subsequent processing, such as formation of electrodes, whereby reproducibility and production yield are improved. Further, in the selective etching using the masks, the resulting stripe-shaped groove is deeper in a region sandwiched by relatively wide portions of the masks than in a region sandwiched by relatively narrow portions of the masks. On the other hand, in the selective crystal growth using the masks, the grown layers are thicker in the region sandwiched by the relatively wide portions than in the region sandwiched by the relatively narrow portions. Since these two effects offset each other, a difference in level at the boundary between the function elements is reduced, whereby subsequent processing, such as formation of electrodes, is facilitated. Further, the optical transmission loss at the waveguide boundary part is reduced.

According to a seventh aspect of the present invention, in a method for fabricating a semiconductor optical device in which a plurality of functional elements are integrated, first of all, a semiconductor wafer having a {100} surface orientation is prepared, and a pair of masks are formed on the surface of the wafer so that a stripe-shaped region of the wafer extending in a [011] direction is exposed between the masks. Each mask has portions of different widths corresponding to the respective functional elements. Using the masks, a cladding layer of a first conductivity type, a multiple quantum well layer, and a cladding layer of a second conductivity type, opposite the first conductivity type, are selectively grown on the wafer, forming a stripe-shaped mesa having a triangular cross section in the stripe-shaped region between the masks. After removal of the masks, a current blocking layer is grown to bury the stripe-shaped mesa, leaving a top portion of the mesa exposed. Finally, a second conductivity type semiconductor layer is grown to completely bury the mesa and make the surface of the wafer flat. The flat surface of the wafer after the crystal growth process facilitates subsequent processing, such as formation of electrodes, whereby reproducibility and production yield are improved.

According to an eighth aspect of the present invention, a semiconductor optical device in which first and second functional elements are integrated on a substrate, includes a first multiple quantum well layer having a relatively thick portion in a region where the first element is located and a relatively thin portion in a region where the second element is located, and a second multiple quantum well layer having a relatively thin portion in the region where the first element is located and a relatively thick portion in the region where the second element is located. Therefore, each of the first and second multiple quantum well layers includes well layers of optimum thickness and number for each functional element, resulting in a semiconductor optical device with improved characteristics.

According to a ninth aspect-of the present invention, in a method for fabricating a semiconductor optical device in which a first and second functional elements are integrated on a semiconductor substrate, initially, a first mask pattern for selective growth is formed on a region of the semiconductor substrate where the first function element is to be located. Using the first mask pattern, a first multiple quantum well layer is grown on the semiconductor substrate by vapor phase deposition so that the thickness of the first multiple quantum well layer is larger in the region where the first element is to be located than in a region where the second functional element is to be located. After removal of the first mask pattern, a second mask pattern for selective growth is grown on the region where the second functional element is to be located and, using the second mask pattern, a second multiple quantum well layer is grown on the first multiple quantum well layer by vapor phase deposition so that the thickness of the second multiple quantum well layer be larger in the region where the second functional element is to be located than in the region where the first function element is to be located. Therefore, the thickness and number of well layers included in each of the first and second multiple quantum well layers can be optimized for each function element, whereby a semiconductor optical device with improved characteristics is easily fabricated. Further, the thicknesses of the first and second multiple quantum well layers gradually vary at the boundary between the first and second element regions, so that the distribution of light is not suddenly changed, resulting in a semiconductor optical device with high optical coupling efficiency.

BRIEF DESCRIPTION OF THE DRAWINGS

FIGS. 26(a)–26(i) are sectional views and perspective views illustrating process steps in a method for fabricating the device shown in FIGS. 25(a)–25(b).

DETAILED DESCRIPTION OF THE PREFERRED EMBODIMENTS

Figure 1A:
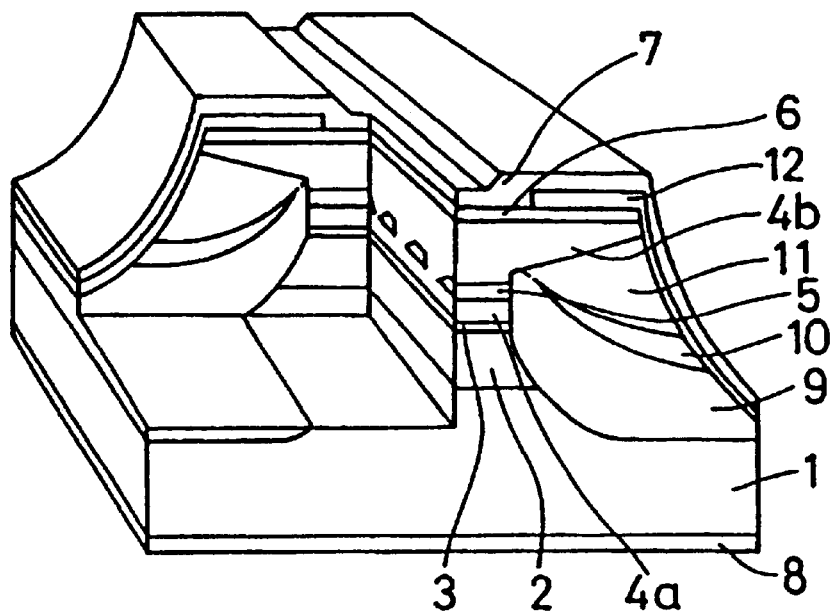
FIGS. 1(a) and 1(b) are a perspective view and a sectional view illustrating a semiconductor laser in accordance with a first embodiment of the present invention.
Figure 1B:
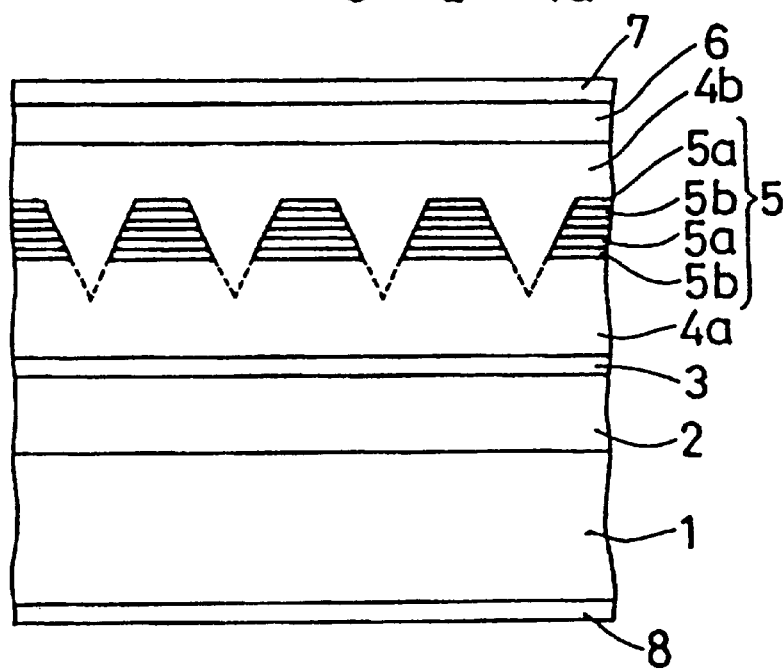

FIG. 1(a) is a perspective view, partially in section, illustrating a semiconductor laser in accordance with a first embodiment of the present invention, and FIG. 1(b) is a sectional view of a part of the semiconductor laser shown in FIG. 1(a) taken along the resonator length direction.

In these figures, reference numeral 1 designates an n type InP substrate. An n type InP lower cladding layer 2 is disposed on the substrate 1. An n type InGaAsP active layer 3 is disposed on the lower cladding layer 2. A p type InP first upper cladding layer 4a is disposed on the active layer 3. A diffraction grating 5 comprising alternatingly arranged p type InGaAs layers 5a and p type InP layers 5b is disposed on the first upper cladding layer 4a. The uppermost layer of the diffraction grating 5 is the p type InGaAs layer 5a. A p type InP second upper cladding layer 4b is disposed on the first upper cladding layer 4a and on the diffraction grating 5. A p type InGaAs contact layer 6 id disposed on the second upper cladding layer 4b. The double-heterojunction structure comprising the active layer 3, the lower cladding layer 2, and the upper cladding layers 4a and 4b is formed in a narrow stripe-shaped mesa. An n type InP mesa embedding layer 9 is disposed on the substrate 1, contacting opposite sides of the stripe-shaped mesa. A p type InP current blocking layer 10 and an n type InP current blocking layer 11 are successively disposed on the mesa embedding layer 9 at the opposite sides of the mesa. An insulating film 12 including a window opposite the stripe-shaped mesa is disposed on the top and side surfaces of the laser structure. A p side electrode 7 is disposed on the insulating film 12, contacting the InGaAs contact layer 6 through the window in that insulating film 12. An n side electrode 8 is disposed on the rear surface of the substrate 1.

Figure 2A:
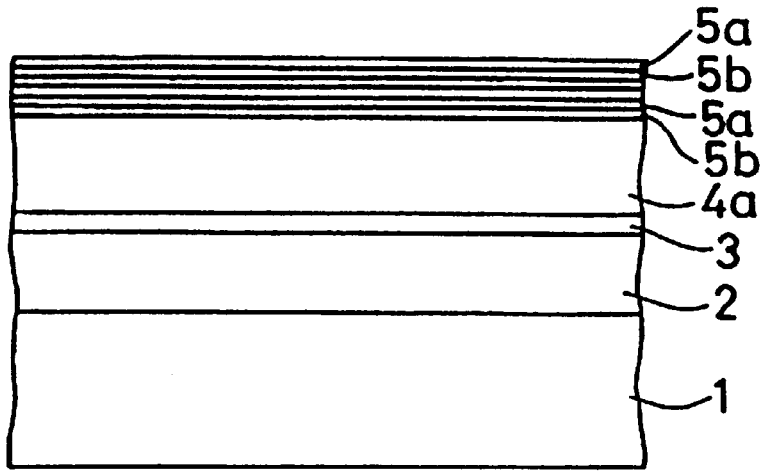
FIGS. 2(a)–2(c) are sectional views illustrating process steps in a method for fabricating the semiconductor laser of FIGS. 1(a)–1(b).
Figure 2B:
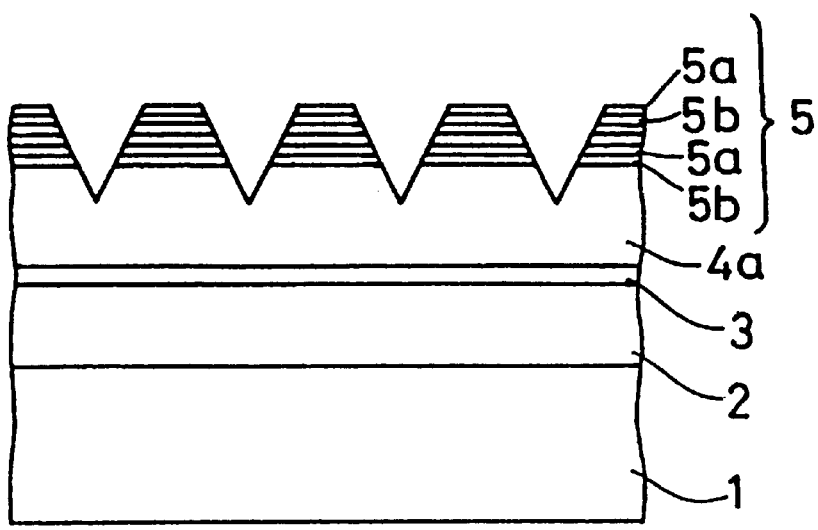
Figure 2C:
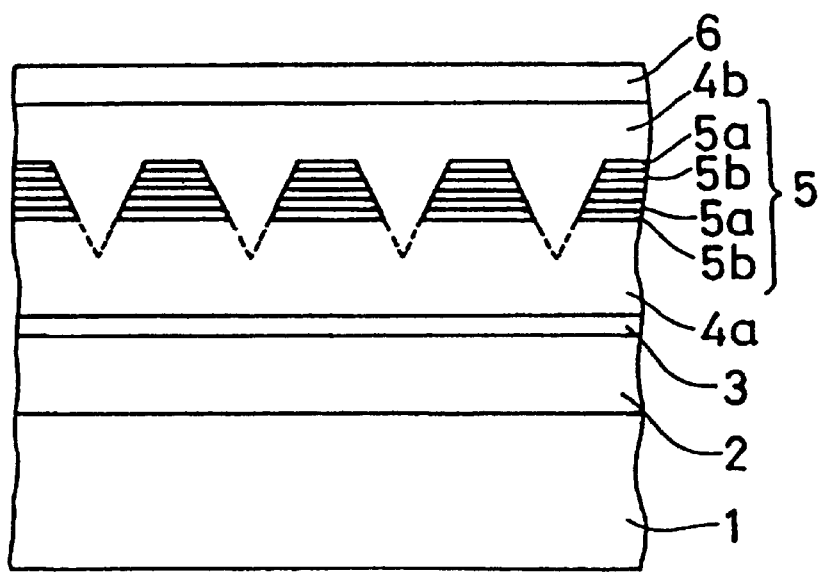

A method of fabricating the laser structure of FIGS. 1(a)–1(b) is illustrated in FIGS. 2(a)–2(c).

Initially, as illustrated in FIG. 2(a), an n type InP lower cladding layer 2 about 1.5 μm thick, an n type InGaAsP active layer 3 about 0.1 μm thick, a p type InP first upper cladding layer 4a about 1 μm thick, and a superlattice layer about 400 Å thick and comprising alternating p type InP layers 5a and p type InGaAs layers 5b are successively grown on the n type InP substrate 1, preferably by the MOCVD.

A photoresist film (not shown) is deposited on the superlattice layer and patterned by two-luminous-flux interference exposure method. This structure is etched using the photoresist pattern as-an etching mask until the etching front reaches into the p type InP first upper cladding layer 4a. Preferably, chemical etching using HBr is employed. As a result of that etching, a periodic pattern of stripe-shaped grooves that are parallel to each other in the resonator length direction of the laser is formed in the superlattice layer, producing a diffraction grating 5 (FIG. 2(b)).

After removal of the photoresist pattern, a p type InP second upper cladding layer 4b is grown over the entire surface of the wafer to embed the diffraction grating 5, preferably by MOCVD (FIG. 2(c)). In the vapor phase growth of the second upper cladding layer 4b, if the diffraction grating comprises only an InGaAsP layer as in the prior art, phosphorus (P) having a relatively high vapor pressure evaporates from the InGaAsP layer and mass transport of group-III elements (In and Ga) occurs, i.e., a lot of group-III atoms are transferred to the bottom of the grooves, whereby the shape of the diffraction grating is not maintained.

In order to avoid the above-described problem, in this first embodiment of the present invention, the diffraction grating 5 is formed by patterning the superlattice layer in which the layers 5a comprising a semiconductor material having a refractive index higher than desired for the whole diffraction grating and restraining the mass transport, such as $In_{0.53}Ga_{0.47}As$, and the layers 5b comprising a semiconductor material having a refractive index lower than desired for the whole diffraction grating, such as InP, are alternatingly arranged with the layer 5a at the surface. Since the InGaAs layer 5a including no phosphorus (P), that has a high vapor pressure and causes the mass transport, is present at the top of the diffraction grating 5, the shape of the diffraction grating 5 is maintained.

Thereafter, an n type InP layer 9, a p type InP current blocking layer 10, and an n type InP current blocking layer 11 are successively grown on the substrate 1 at opposite sides of the mesa structure. Then, a p type InGaAs contact layer 6 is formed on the entire surface of the wafer. To complete the laser structure shown in FIG. 1(a), an insulating film 12 is deposited and a window in that film is opened, followed by the formation of the p side and n side electrodes 7 and 8.

A description is given of the operation. In the DFB semiconductor laser fabricated as described above, when a forward bias is applied across the p side electrode 7 and the n side electrode 8, electrons and holes are injected into the active layer 4 and recombine to produce light.

Since the semiconductor laser of this first embodiment has a waveguide structure as in the prior art laser, the produced light travels in a direction parallel to the active layer 3. Further, the effective refractive index of light traveling toward the upper cladding layer is changed by the periodic diffraction grating 5 and Bragg-reflected, resulting in laser oscillation. The coupling constant that indicates the ratio of light subjected to distributed feedback is determined by the thickness, amplitude, pitch, and the like of the diffraction grating. In this embodiment, since the shape of the diffraction grating is maintained when the p type InP second upper cladding layer 4b is grown thereon, the actual coupling constant can be a design value with high reproducibility.

The refractive index and thickness of the diffraction grating layer are important parameters determining the coupling constant. In the prior art laser device, for example, a p type InGaAsP layer having a refractive index of 3.3 and a thickness of 400 Å is employed as the diffraction grating layer.

In this embodiment of the present invention, a diffraction grating layer having a refractive index of 3.3 and a thickness of 400 Å is achieved by alternatingly arranging four p type InP layers 5b (70 Å thick, refractive index=3.2) and four p type $In_{0.53}Ga_{0.47}As$ layers 5a (30 Å thick, refractive index= 3.5). Further, the refractive index of the diffraction grating layer is easily controlled by varying the ratio of the thickness of the layer 5a restraining the mass transport to the thickness of the layer 5b facilitating the mass transport.

While in the above-described first embodiment a DFB semiconductor laser including a conductive n type InP substrate is employed, the present invention may be applied to other elements including a semi-insulating substrate or a p type InP substrate. In addition, the present invention may be applied to DFB semiconductor lasers comprising GaAs or other semiconductor materials.

Furthermore, while in the above-described first embodiment a DFB semiconductor laser is employed, the present invention may be applied to other elements including gratings, for example, a waveguide type grating filter or a reflection type grating polarizer.

Figure 3:
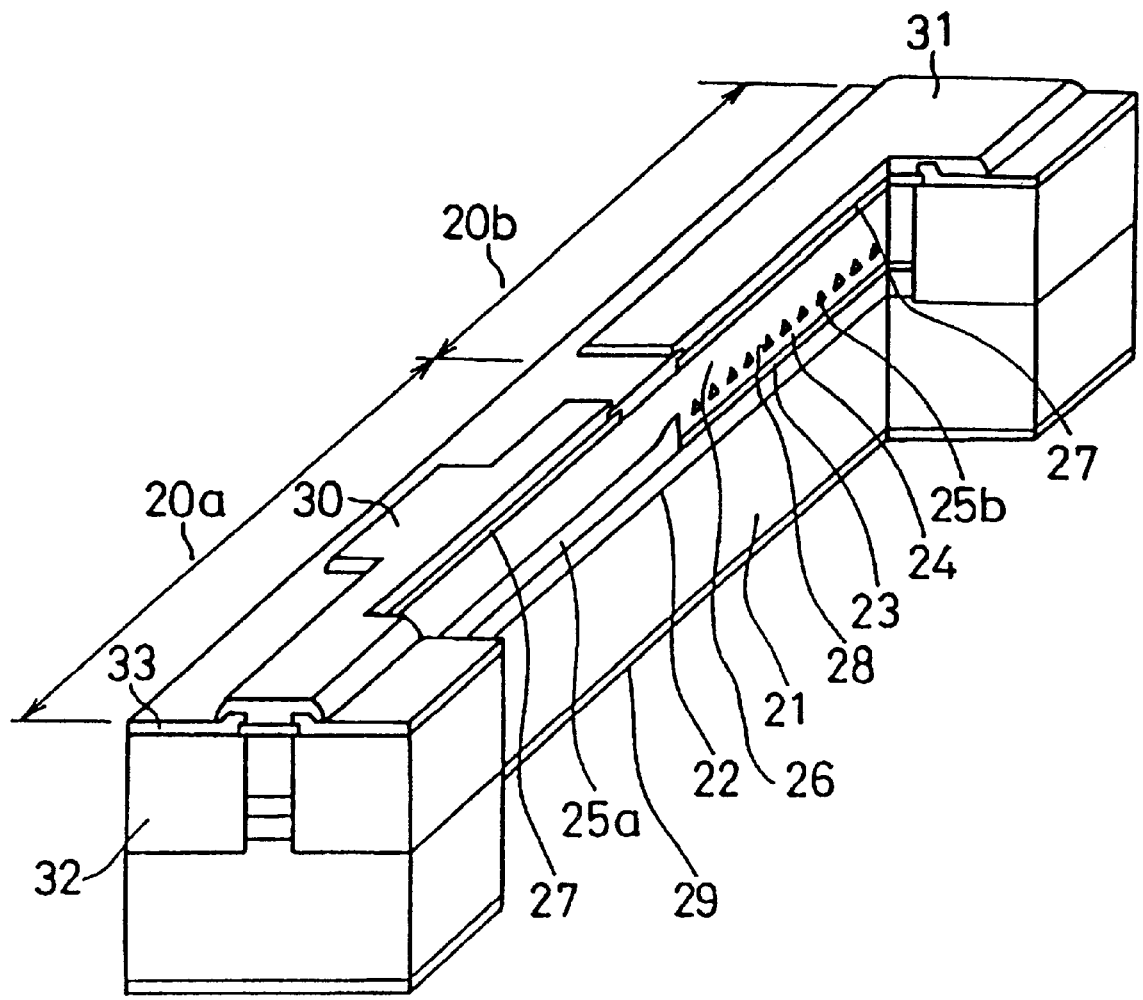
FIG. 3 is a perspective view illustrating an integrated DFB-LD and light modulator in accordance with a second embodiment of the present invention.
Figure 4:
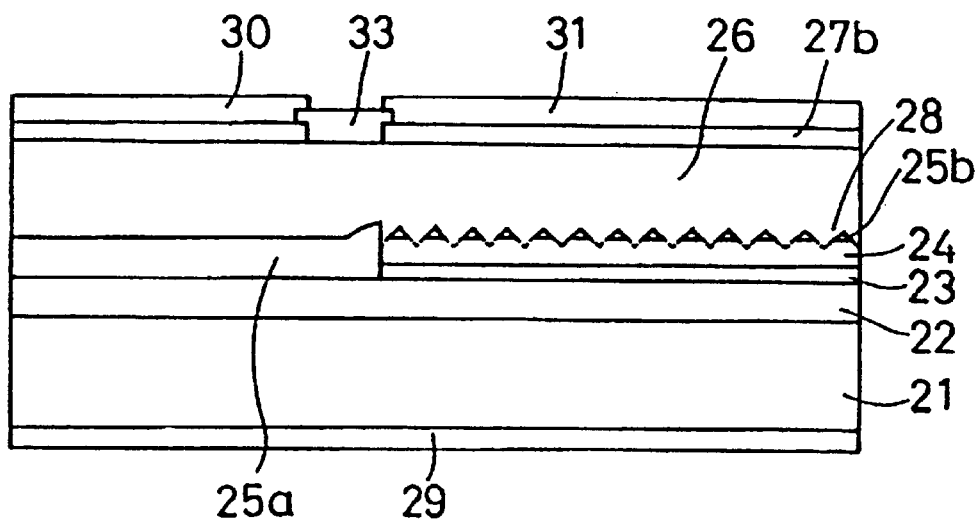
FIG. 4 is a sectional view of the structure shown in FIG. 3 taken along the resonator length direction of the DFB-LD.

FIG. 3 is a perspective view, partially in section, illustrating an integrated semiconductor laser and light modulator in accordance with a second embodiment of the present invention. FIG. 4 is a sectional view of the structure of FIG. 3 taken along resonator length direction of the laser.

In these figures, reference numeral 21 designates an n type InP substrate. A light modulator 20a and a laser diode 20b are integrated on the InP substrate 21. An n type InP buffer layer (lower cladding layer) 22 is disposed on the substrate 21. An InGaAsP active layer 23 (band gap energy $E_g$=0.80 eV) of the LD 20b is disposed on a part of the buffer layer 22. A p type InP barrier layer 24 is disposed on the active layer 23. A diffraction grating 28 is disposed on the barrier layer 24. The diffraction grating 28 comprises a periodic pattern of stripe-shaped portions 25b of an InGaAsP light guide layer ($E_g$=0.85 eV). An InGaAsP light absorption layer 25a of the modulator 20a is disposed on a part of the buffer layer 22 where the active layer 23 is absent. A p type InP cladding layer 26 is disposed on the light absorption layer 25a, the barrier layer 24, and the diffraction grating 28. P type InGaAsP contact layers 27a and 27b are disposed on the cladding layer 26. A p side electrode 30 of the modulator 20a is disposed on the contact layer 27a, and a p side electrode 31 of the LD 20b is disposed on the contact layer 27b. An n side electrode common to the modulator and the LD is disposed on the rear surface of the substrate 21. Reference numeral 32 designates a high resistivity InP layer, and numeral 33 designates an insulating film.

A method for fabricating the structure of FIG. 3 is illustrated in FIGS. 6(a)–6(h). In FIGS. 6(a)–6(h), the same reference numerals as in FIGS. 3 and 4 designate the same parts.

Figure 6A:
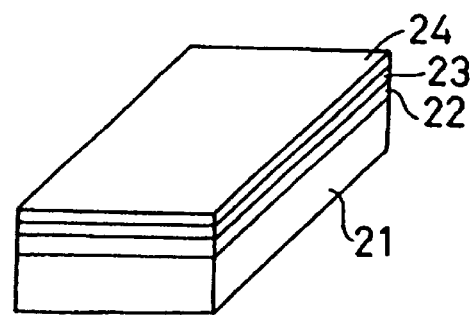
FIGS. 6(a)–6(h) are perspective views illustrating process steps in a method for fabricating the structure shown in FIG. 3.

Initially, as illustrated in FIG. 6(a), an n type InP buffer layer 22, an InGaAsP active layer 23, and a p type InP barrier layer 24 are successively grown on the n type InP substrate 21 by MOCVD.

Figure 6B:
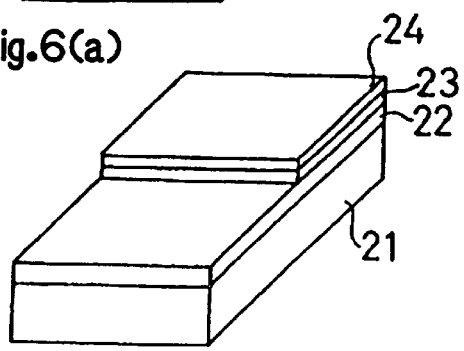

In the step of FIG. 6(b), portions of the p type InP barrier layer 24 and the InGaAsP active layer 23 in a region where a light modulator is to be located (hereinafter referred to as modulator region) are selectively removed by photolithography and etching.

Figure 6C:
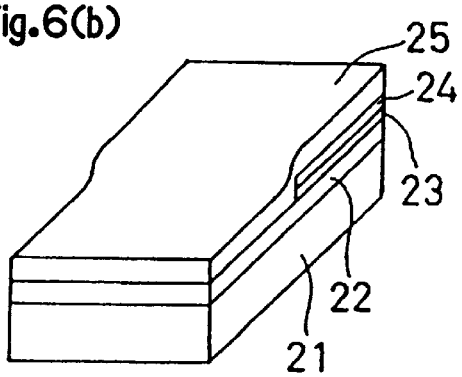

In the step of FIG. 6(c), an InGaAsP light absorption and light guide layer 25 about 0.3 μm thick is grown over the entire surface of the wafer.

Figure 6D:
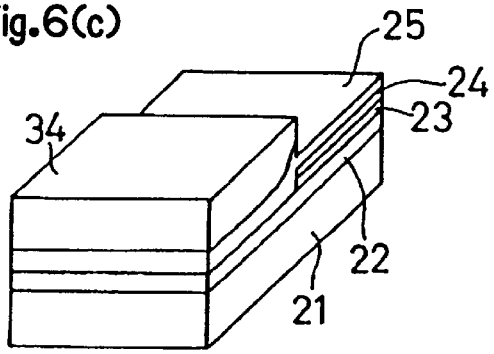
Figure 6E:
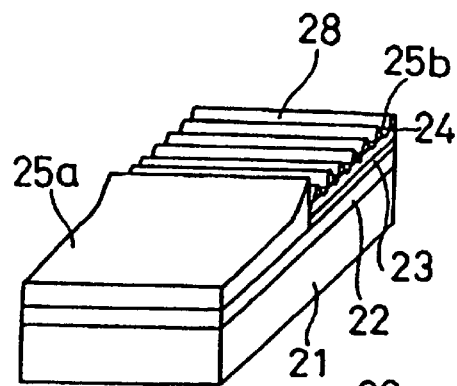

In the step of FIG. 6(d), the modulator region of the wafer is covered with a photoresist film 34, and a portion of the InGaAsP light absorption and light guide layer 25 that will become a light guide layer of the LD is etched to a thickness of about 500 Å. Thereafter, as illustrated in FIG. 6(e), a periodic pattern of stripe-shaped grooves are formed in the light guide layer 25, reaching into the p type InP barrier layer 24, whereby a diffraction grating 28 comprising a plurality of stripe-shaped island portions 25b of the light guide layer 25 is fabricated.

Figure 6F:
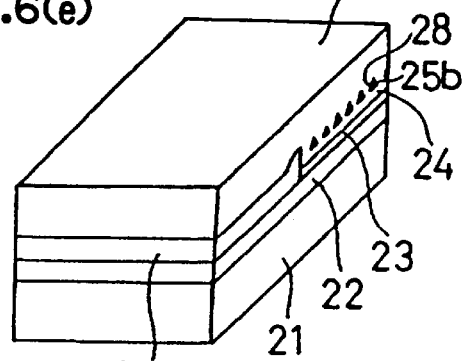
Figure 6G:
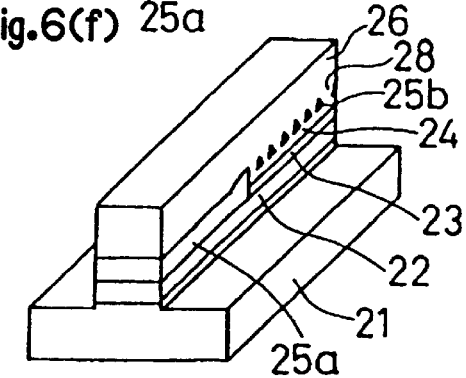
Figure 6H:
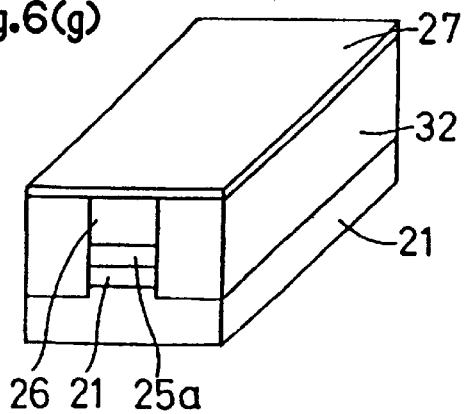

In the step of FIG. 6(f), a p type InP upper cladding layer 26 is formed over the entire surface of the wafer. Thereafter, those layers grown on the substrate 21 are formed in a stripe-shaped mesa by etching (FIG. 6(g)), and Fe-doped InP layer is grown on the substrate 21 contacting opposite sides of the mesa. Thereafter, a p type InGaAsP contact layer 27 is formed on the entire surface of the wafer.

Thereafter, a portion of the p type InGaAsP contact layer 27 opposite the boundary between the LD and the modulator is removed to electrically separate the LD from the modulator. To complete the structure of FIG. 3, p side electrodes 30 and 31 and a common n side electrode 29 are produced.

Figure 25A:
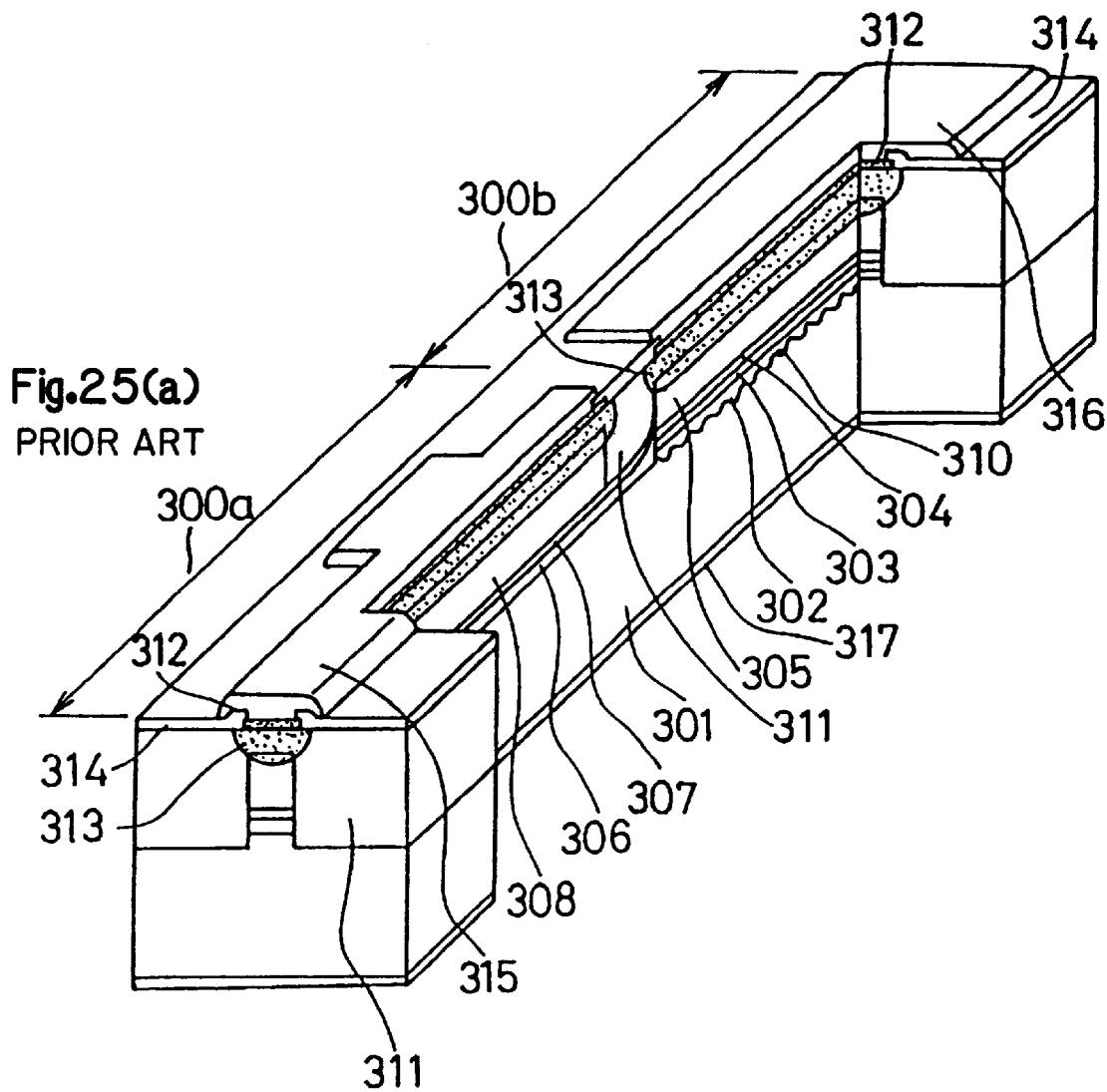
FIGS. 25(a) and 25(b) are a perspective view and a sectional view illustrating an integrated DFB-LD and light modulator according to the prior art.
Figure 25B:
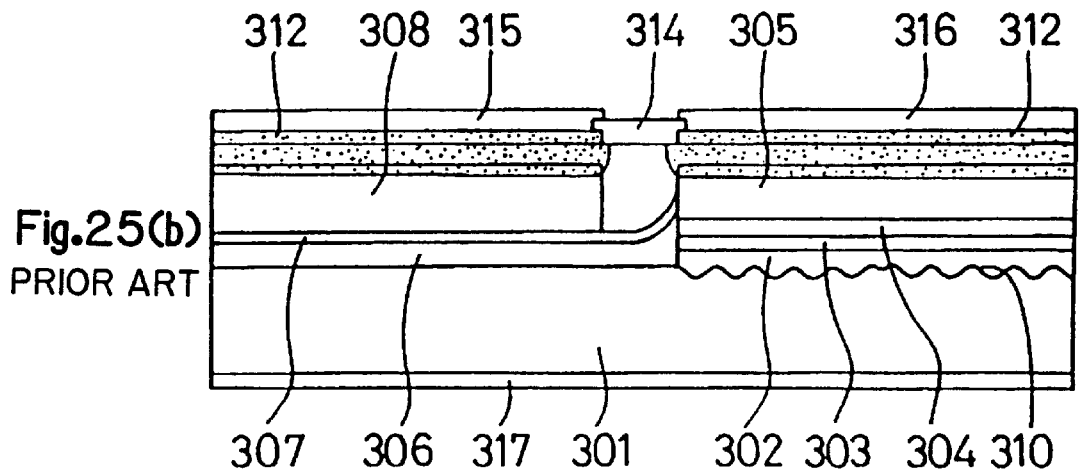
Figure 27:
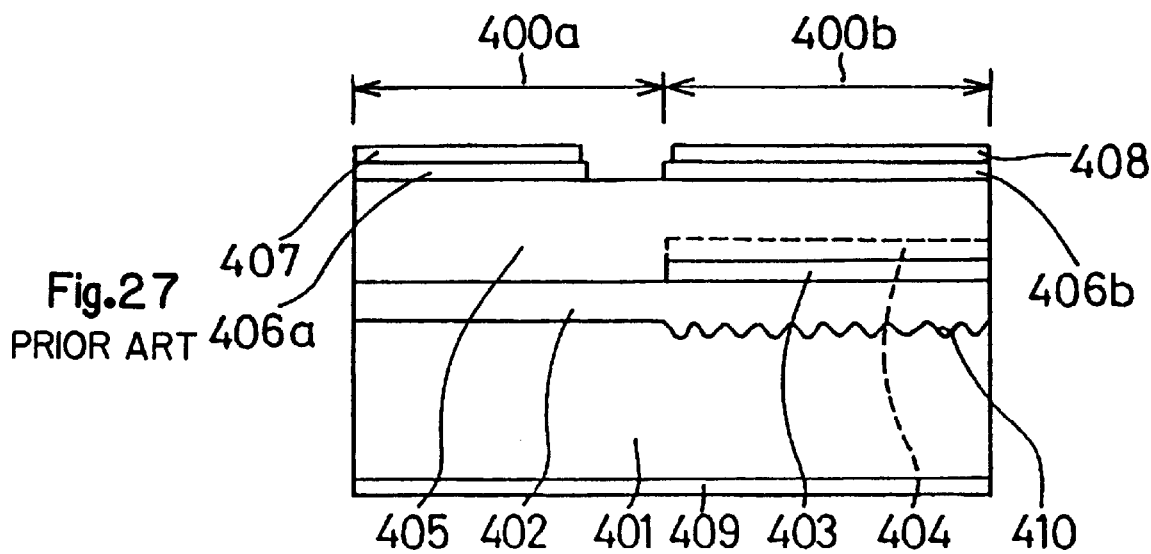
FIG. 27 is a sectional view illustrating an integrated DFB-LD and light modulator in accordance with the prior art.
Figure 28A:
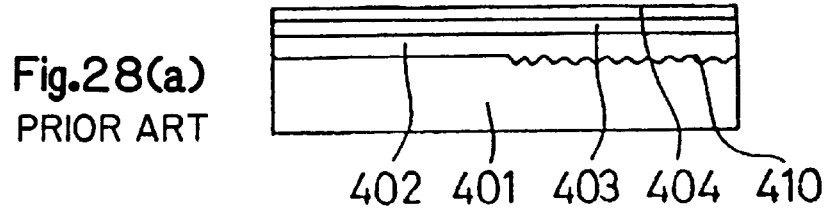
FIGS. 28(a)–28(c) are sectional views illustrating process steps in a method for fabricating the structure of FIG. 27.
Figure 28B:
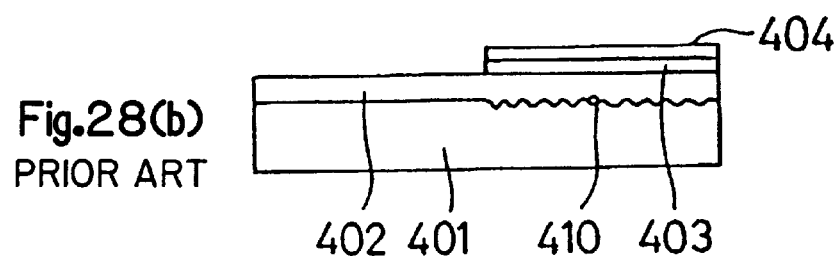
Figure 28C:
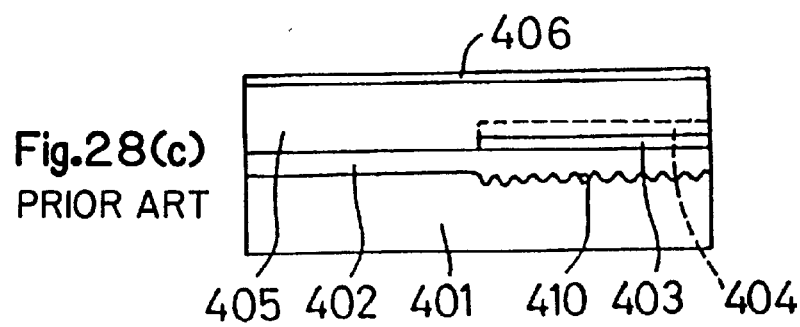
Figure 29:
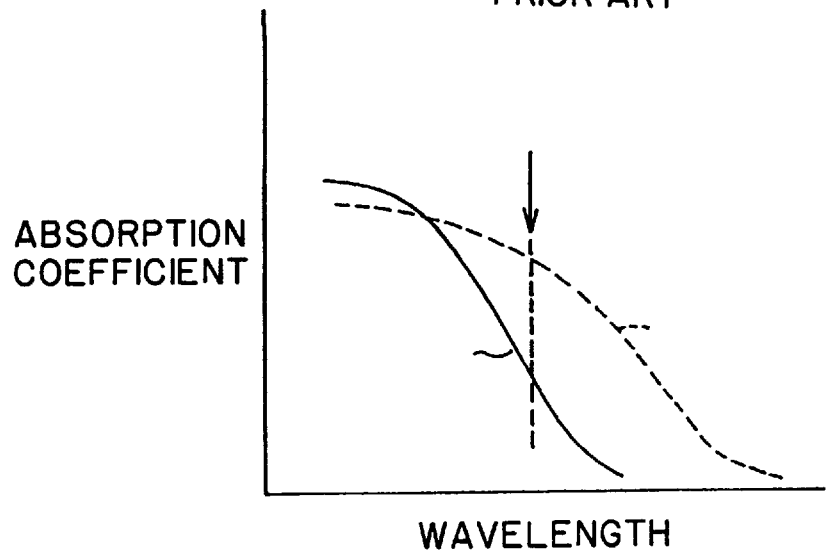
FIG. 29 is a diagram for explaining light absorption characteristics of a light absorption layer comprising a bulk crystal.
Figure 30:
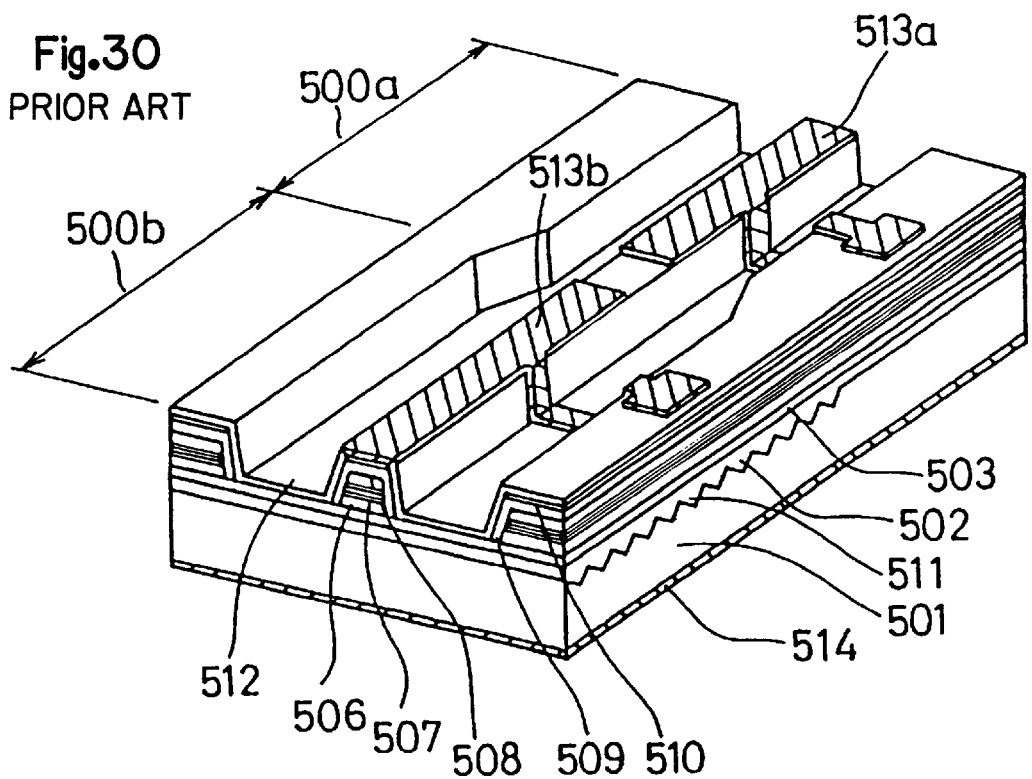
FIG. 30 is a perspective view illustrating an integrated DFB-LD and light modulator in accordance with the prior art.
Figure 31A:
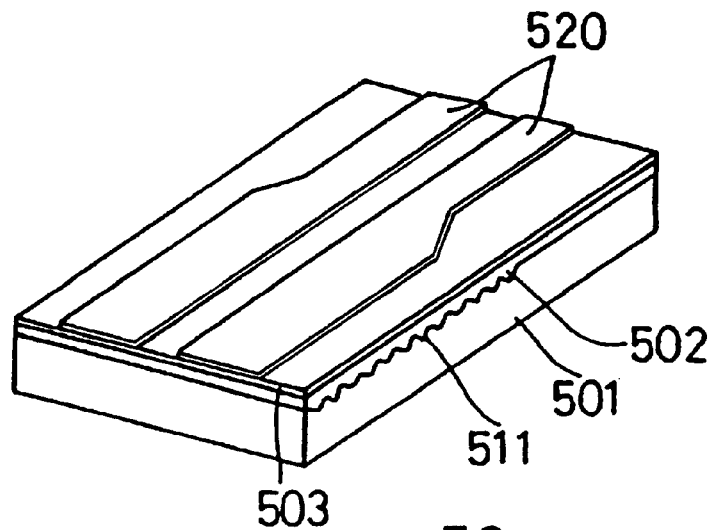
FIGS. 31(a)–31(c) are perspective views illustrating process steps in a method for fabricating the structure of FIG. 30.
Figure 31B:
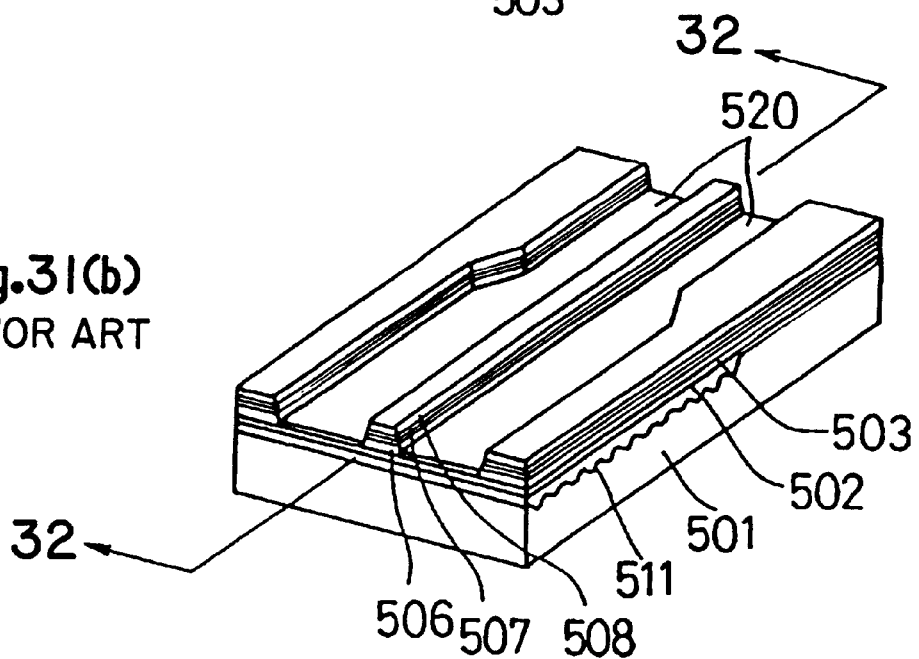
Figure 31C:
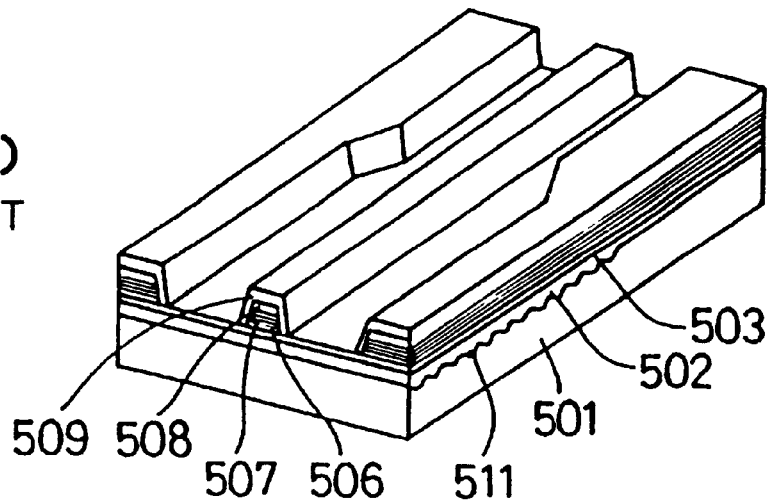

The operating principle of the integrated semiconductor laser and light modulator shown in FIG. 3 is identical to those of the prior art devices already described with respect to FIGS. 25(a)–25(b) and 27.

In the integrated semiconductor laser and light modulator according to the second embodiment of the present invention, the thickness of the light guide layer of the LD, i.e., a portion of the light guide and light absorption layer 25 in the LD region, is reduced from about 0.3 μm to about 500 Å by etching and, thereafter, the light guide layer is patterned in a plurality of stripe-shaped island portions 25b to form the diffraction grating 28. Therefore, the resistance and the absorption loss due to the light guide layer is reduced to about ⅕ of those of the prior art device. Further, since the diffraction grating 28 consists of a plurality of island portions 25b that are embedded in the InP layer, the resistance and the absorption loss of the whole device is further reduced to about ¹⁄₁₀ of those of the prior art device, whereby the problems in the conventional device, such as increases in the operating voltage and the threshold current and reduction in the efficiency are avoided.

While in the above-described second embodiment a p type InGaAsP layer about 0.3 μm thick is used as the light absorption and light guide layer 25, a strained multiple quantum well layer may be used.

Figure 5:
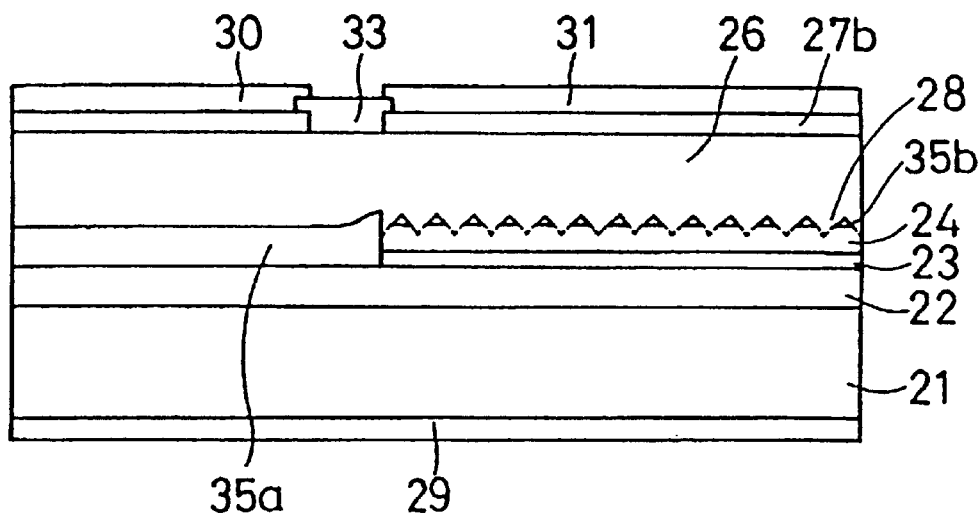
FIG. 5 is a sectional view of an integrated DFB-LD and light modulator taken along the resonator length direction of the DFB-LD, in accordance with a third embodiment of the present invention.

FIG. 5 is a sectional view illustrating an integrated semiconductor laser and light modulator including a strained MQW layer as a light absorption and light guide layer, in accordance with a third embodiment of the present invention. In FIG. 5, the same reference numerals as in FIG. 4 designate the same or corresponding parts. Reference numeral 35a designates a strained MQW light absorption layer and numeral 35b designates a strained MQW light guide layer. The strained MQW layer comprises alternatingly arranged InGaAsP well layers and InGaAsP barrier layers. The InGaAsP well layer is about 50 Å thick and has a lattice constant that provides 1% compressive strain with respect to the lattice of InP. The InGaAsP barrier layer has a band gap energy larger than that of the well layer and a lattice constant that matches with the lattice constant of InP.

In a strained MQW layer, the effective mass of the valence band is reduced, whereby the inter valence band absorption that accounts for a high percentage of the absorption loss is significantly reduced. The reason for the phenomenon is described in detail in "Band Engineering of Semiconductor Lasers for Optical Communications", Journal of Lightwave Technology, Vol. 6, No. 8, p.1292 (1988).

The reduction in the absorption loss in the LD region improves characteristics of the LD, such as threshold current and efficiency. In addition, the reduction in the absorption loss in the light modulator region reduces the insertion loss of the modulator.

Figure 7:
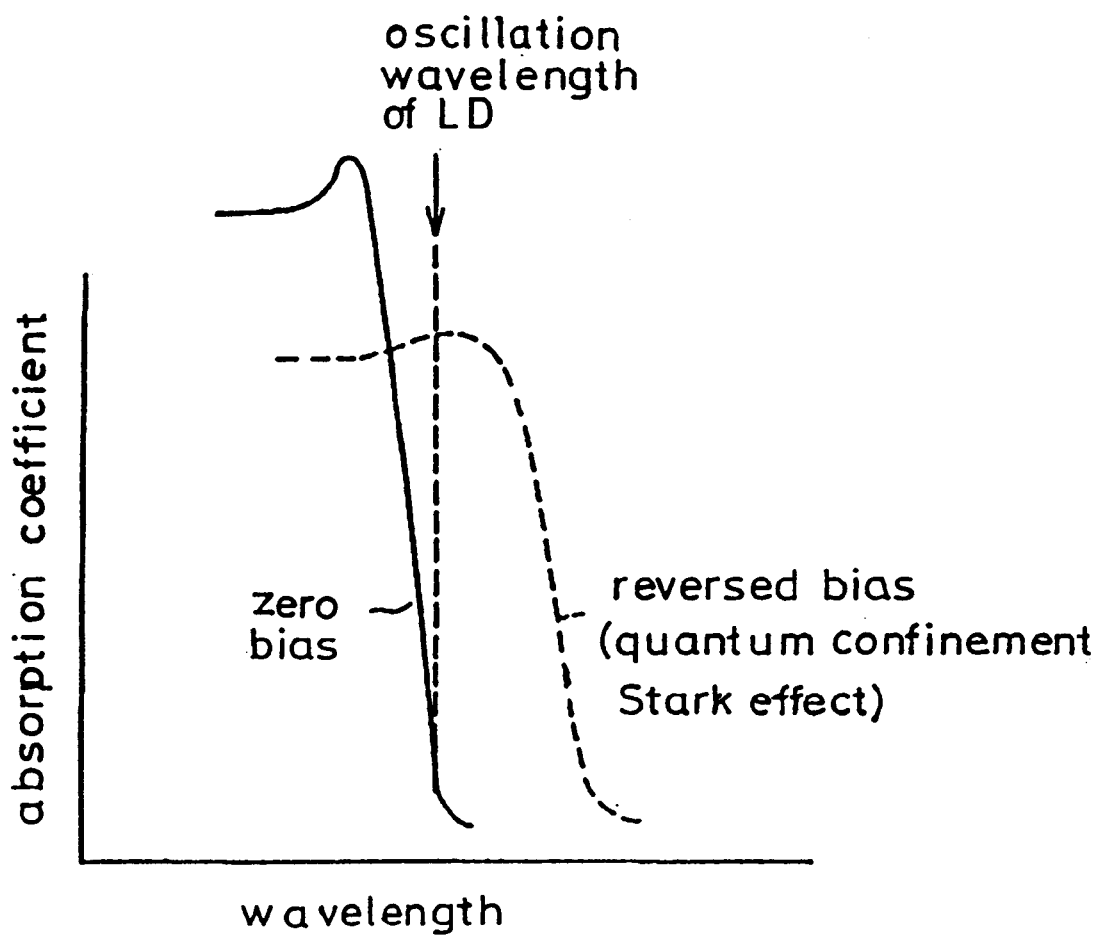
FIG. 7 is a diagram for explaining light absorption characteristics of a multiple quantum well absorption layer.

FIG. 7 is a diagram for explaining light absorption characteristics of an MQW light absorption layer. In FIG. 7, the characteristic curve showing wavelength dependence of absorption coefficient has a peak in the vicinity of the band gap energy, so that the absorption coefficient drops steeply. When a reverse bias is applied, since the effective band gap energy is increased due to the quantum confinement Stark effect, the absorption coefficient curve is shifted toward the long wavelength side, so that a large absorption coefficient is obtained. As a result, light modulation with higher efficiency is realized compared to a light absorption layer comprising a bulk crystal.

Figure 8:
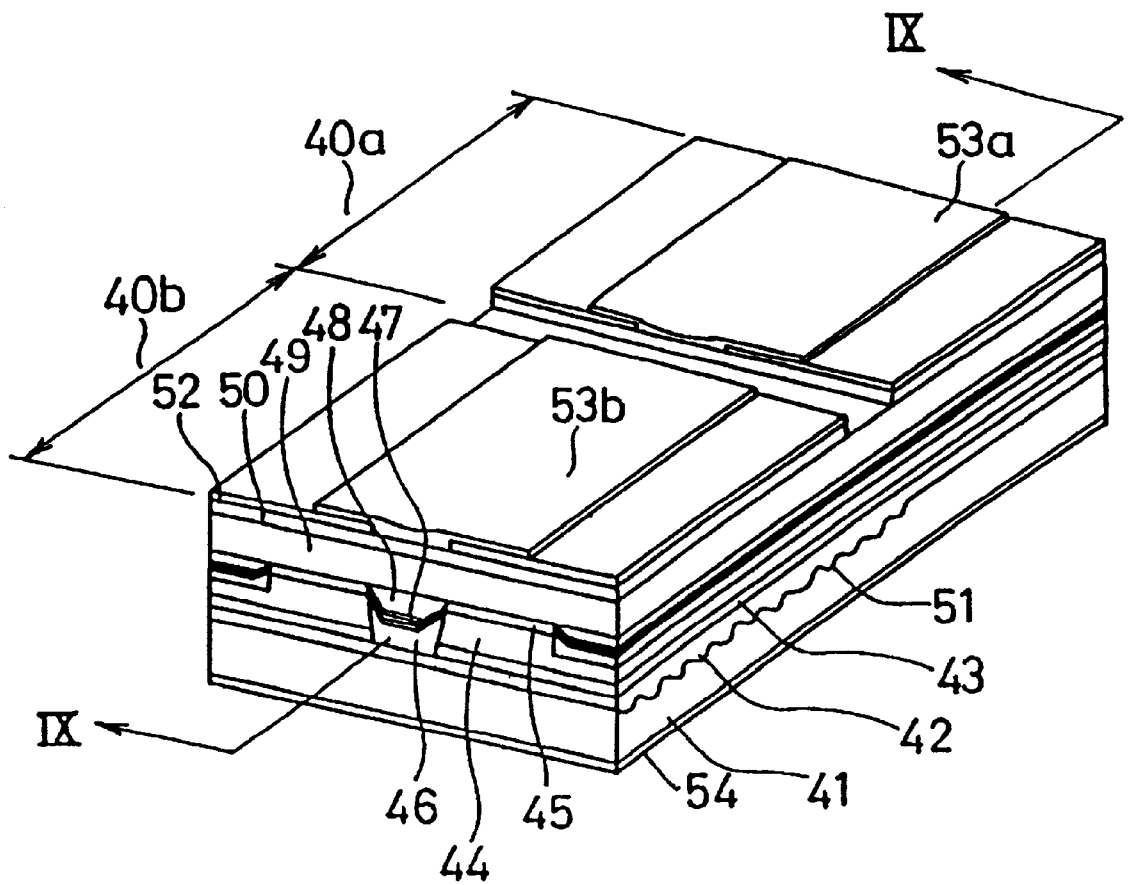
FIG. 8 is a perspective view illustrating an integrated DFB-LD and light modulator in accordance with a fourth-embodiment of the present invention.
Figure 9:
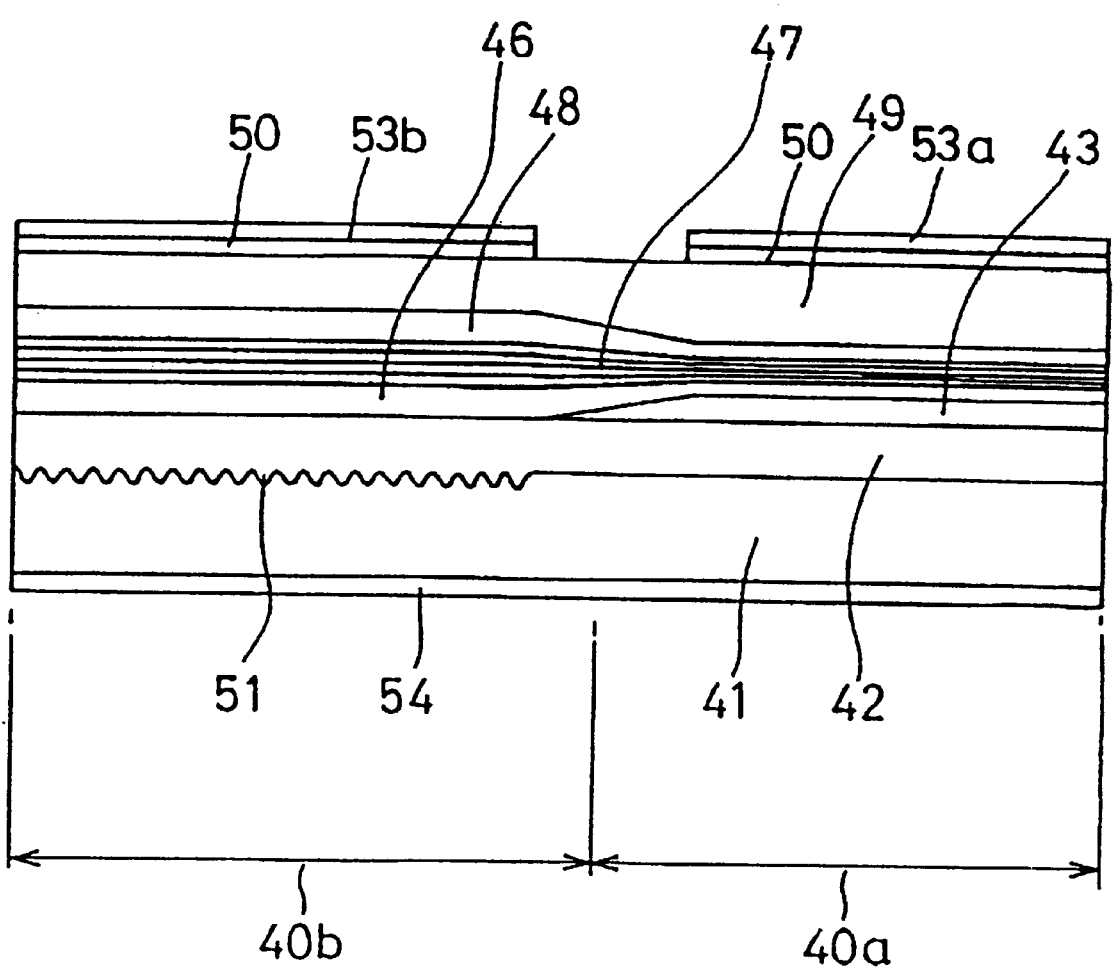
FIG. 9 is a sectional view taken along a line 9—9 of FIG. 8.

FIG. 8 is a perspective view illustrating an integrated semiconductor laser and light modulator in accordance with a fourth embodiment of the present invention. FIG. 9 is a sectional view taken along a line 9—9 of FIG. 8. In FIG. 9, reference numeral 41 designates an n type InP-substrate. A light modulator 40a and a laser diode 40b are integrated on the InP substrate 41. The substrate 41 includes a diffraction grating 51 in a region where the LD 40b is located. An n type InGaAsP guide layer 42 is disposed on the substrate 41 including the diffraction grating 51. An n type InP layer 43 is disposed on a part of the guide layer 42 where the modulator 40b is located. An n type InP cladding layer 46 is disposed on the guide layer 42 and on the n type InP layer 43. The n type InP layer 43 may be present in the LD region 40b. In this case, the n type InP layer in the LD region is thinner than that in the modulator region. An i type InGaAs/InGaAsP multiple quantum well (MQW) layer 47 is disposed on the cladding layer 46. A p type InP cladding layer 48 is disposed on the MQW layer 47. A p type InP layer 49 is disposed on the cladding layer 48. P+ type InGaAsP contact layers 50 are disposed on the InP layer 49 in the LD region and the modulator region, respectively. P side electrodes 53a and 53b of the modulator and the LD, respectively, are disposed on the respective contact layers 50. An n side electrode 54 common to the LD and the modulator is disposed on the rear surface of the substrate 41. In FIG. 8, reference numeral 44 designates an Fe-doped InP current blocking layer, numeral 45 designates an n type InP layer, and numeral 52 designates an SiO$_2$ insulating film.

A method for fabricating the structure of FIG. 8 is illustrated in FIGS. 10(a)–10(d).

Figure 10A:
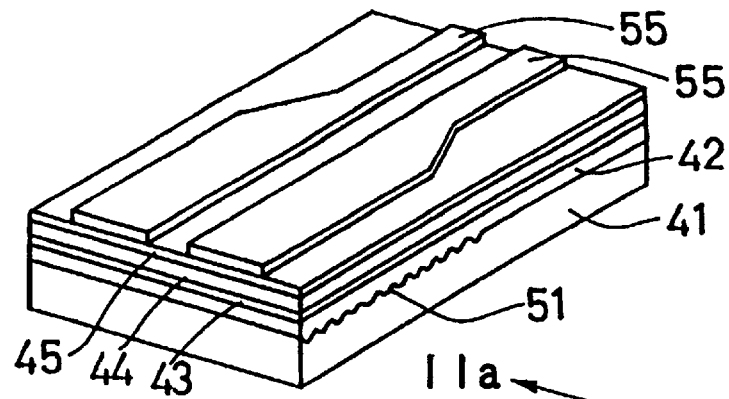
FIGS. 10(a)–10(d) are perspective views illustrating process steps in a method for fabricating the structure of FIG. 8.

Initially, a diffraction grating 51 is formed on a region of the substrate 41 where an LD is to be located (LD region). Thereafter, an n type InGaAsP guide layer 42, an n type InP layer 43, an Fe-doped InP current blocking layer 44, and an n type InP layer 45 are successively grown over the entire surface of the substrate 41 including the diffraction grating 51. Thereafter, as illustrated in FIG. 10(a), a pair of SiO$_2$ insulating films 55 are formed on the n type InP layer 45 with a stripe-shaped region of the InP layer 45, about 2 μm wide, between them. The width of the SiO$_2$ film 55 is about 10 μm in the LD region and about 4 μm in the modulator region.

Figure 10B:
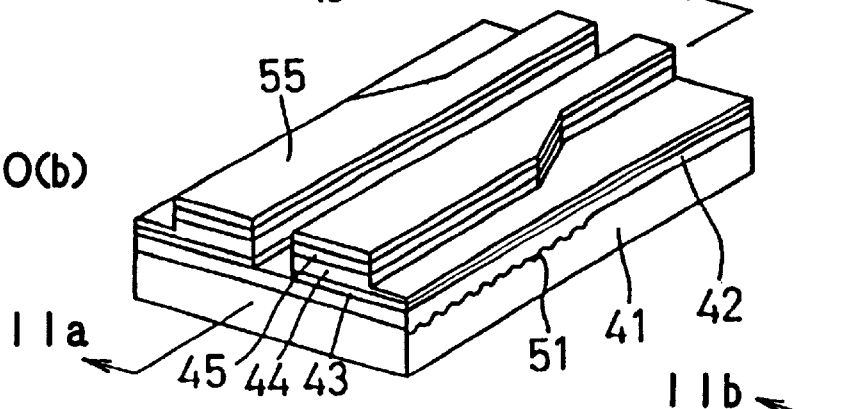
Figure 11A:
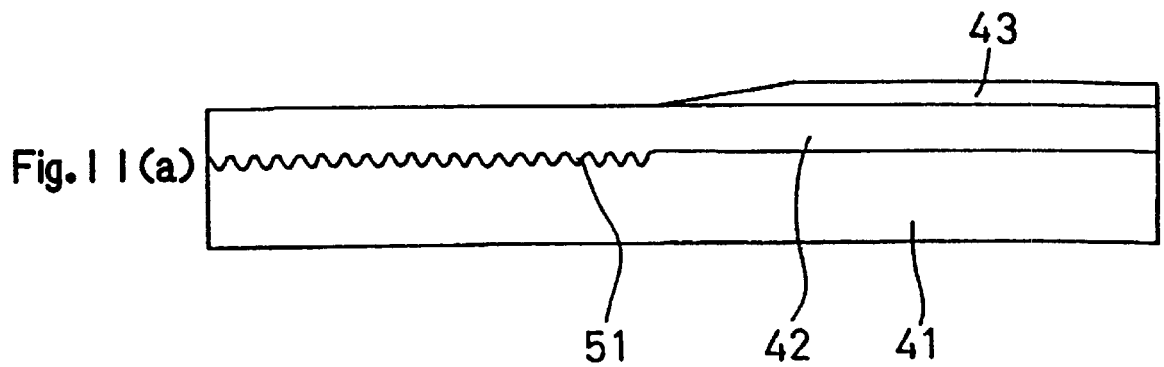
FIGS. 11(a) and 11(b) are sectional views taken along a line 11a—11a of FIG. 10(b) and a line 11b—11b of FIG. 10(b), respectively.

In the step of FIG. 10(b), using the SiO$_2$ films 55 as masks, unmasked portions of the semiconductor layers 43, 44, and 45 are selectively etched by vapor phase etching with HCl gas. In the stripe-shaped region sandwiched by the SiO$_2$ masks 55, the etching depth depends on the width of the SiO$_2$ masks 55. That is, the etching depth in the region sandwiched by the relatively wide portions (about 10 μm) of the masks 55 is deeper than the etching depth in the region sandwiched by the relatively narrow portions (about 4 μm) of the masks 55. The reason of this variation in etching depth is described in detail in Applied Physics Letters, 59 (16), Oct. 14, 1991, pp. 2019 to 2021. FIG. 11(a) is a sectional view of the wafer taken along a line 11a—11a of FIG. 10(b).

Figure 10C:
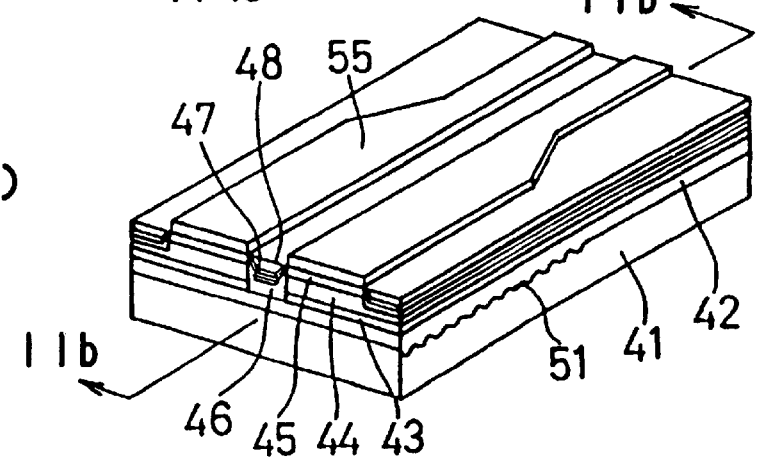
Figure 11B:
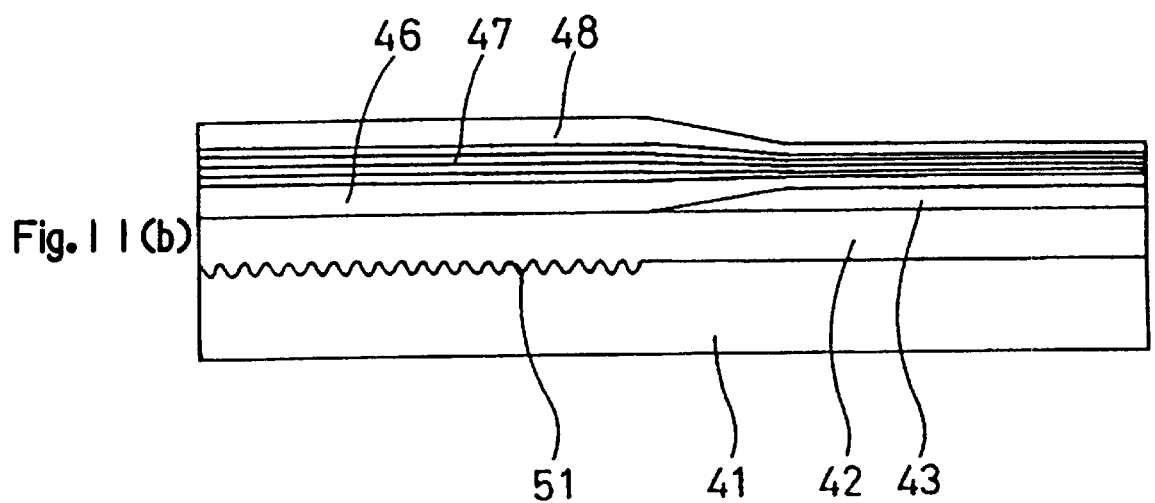

In the step of FIG. 10(c), using the SiO$_2$ films 55 as masks for selective growth, an n type InP cladding layer 46, an i type InGaAs/InGaAsP MQW layer 47, and a p type InP cladding layer 48 are grown on the wafer. The grown layers are thicker in the region between the relatively wide portions of the SiO$_2$ masks 55 than in the region between the relatively narrow portions of the masks 55. FIG. 11(b) is a sectional view of the wafer taken along a line 11b—11b of FIG. 10(c).

Figure 10D:
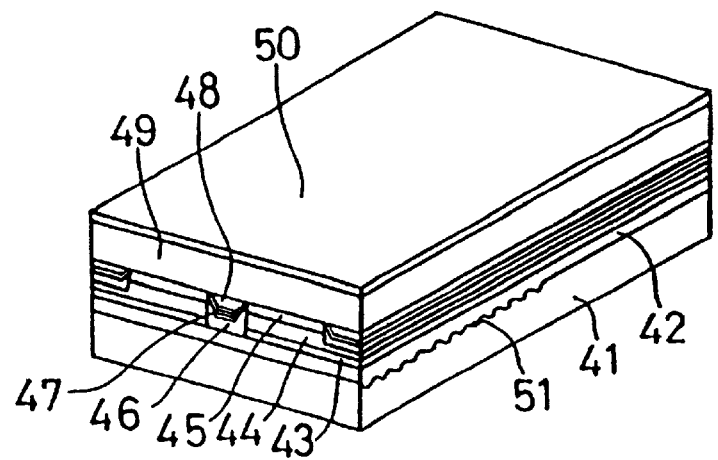

After removal of the SiO$_2$ films 55, a p type InP layer 49 and a p+ type InGaAsP contact layer 50 are grown over the entire surface of the wafer as illustrated in FIG. 10(d).

Thereafter, a part of the contact layer 50 opposite the boundary between the LD and the modulator is etched away, followed by deposition of an SiO$_2$ insulating film 52. The SiO$_2$ film 52 is patterned to form a window about 2 μm wide opposite the stripe-shaped groove. To complete the device of FIG. 8, p side electrodes 53a and 53b for the modulator and the LD, respectively, are formed contacting the contact layer 50 through the window, and an n side electrode 54 common to the modulator and LD is formed on the rear surface of the substrate 41.

The operating principle of the integrated semiconductor laser and light modulator of this fourth embodiment is identical to the operating principle of the prior art device shown in FIG. 27. That is, as shown in FIG. 9, the well layer included in the MQW layer 47 is thicker in the DFB-LD region 40b than in the modulator region 40a, so that the band gap energy of the MQW layer 47 in the LD region is relatively small and the band gap energy of the MQW layer 47 in the modulator region is relatively large. When the modulator 40a is not driven, laser light produced in the LD region is not absorbed in the modulator region, so that it is emitted from the facet of the modulator. When a reverse bias is applied to the modulator, the absorption end shifts toward the long wavelength side due to the quantum confinement Stark effect, and the laser light is quenched.

A description is given of the effect of this fourth embodiment.

In the above-described production of the integrated semiconductor laser and light modulator according to the fourth embodiment, selective growth of the semiconductor layers constituting a waveguide is carried out so that those layers are planar and grown in the groove which is formed in the lamination of semiconductor layers including the current blocking layer. Therefore, a planar surface of the wafer is achieved after the selective growth. The flat surface facilitates subsequent processing, such as formation of windows in the SiO$_2$ film 52 and patterning of electrodes, whereby reproducibility and production yield are improved.

Figure 32:
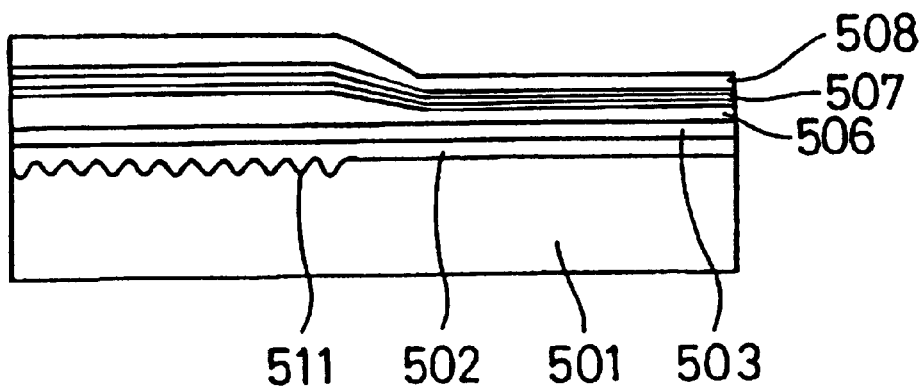
FIG. 32 is a sectional view taken along line 32—32 of FIG. 31(b) for explaining problems in the integrated DFB-LD and light modulator shown in FIG. 30.
Figure 33A:
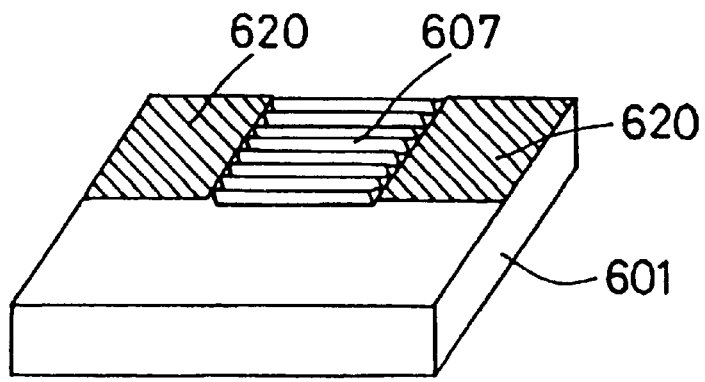
FIGS. 33(a), 33(b), 33(c) are diagrams illustrating process steps in a method for fabricating an integrated DFB-LD and light modulator in accordance with the prior art.
Figure 33B:
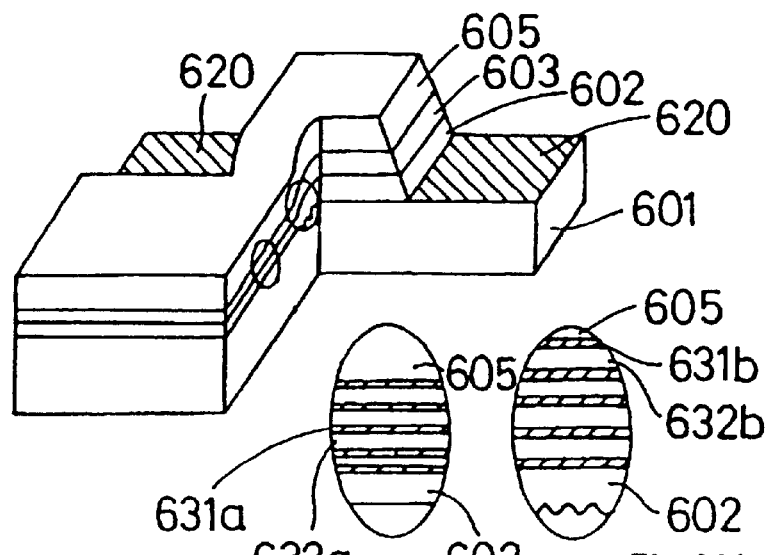
Figure 33C:
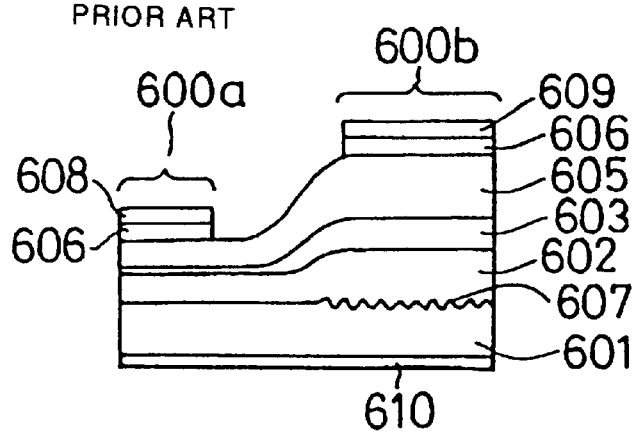

Furthermore, as shown in FIG. 11(a), the groove formed between the SiO$_2$ masks 55 is deeper in the region sandwiched by the relatively wide portions of the masks 55 than in the region sandwiched by the relatively narrow portions of the masks 55. In addition, the layers 46, 47, and 48 grown in the groove between the SiO$_2$ masks 55 are thicker in the region sandwiched by the relatively wide portions of the masks 55 than in the region sandwiched by the relatively narrow portions of the masks 55. The effects of the selective etching and selective growth are based on the same principle. Since the layers 46, 47, and 48 grown in the deep region of the stripe-shaped groove are thick and those layers grown in the shallow region of the groove are thin, the total thickness of the grown layers and the depth of the groove offset each other, reducing the step, i.e., difference in level, at the surface opposite the boundary between the wide portion and the narrow portion of the $SiO_2$ film 55. The reduced step at the surface does not adversely affect subsequent processing, such as the formation of electrodes. Further, in this fourth embodiment, the difference in level of the waveguide comprising the. MQW layer 47 at the boundary between the LD region and the modulator region is significantly reduced as compared with the prior art structure shown in FIG. 32, whereby the transmission loss of light traveling through the waveguide is reduced.

Figure 34:
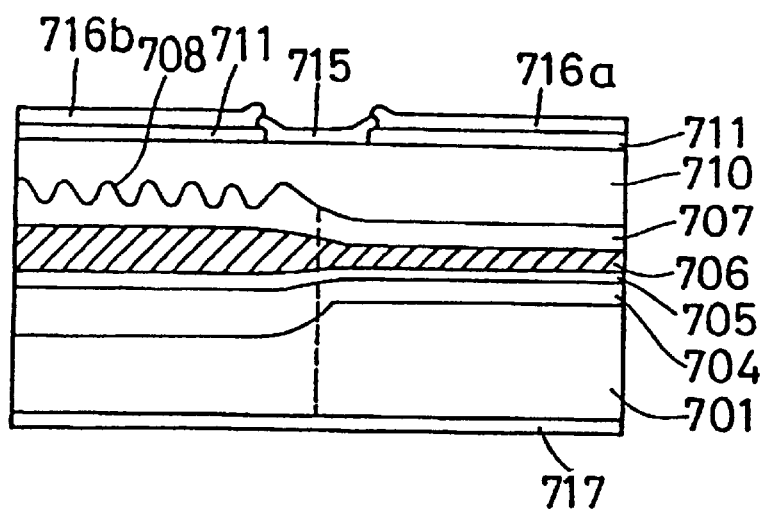
FIG. 34 is a sectional view illustrating an integrated DFB-LD and light modulator in accordance with the prior art.
Figure 35A:
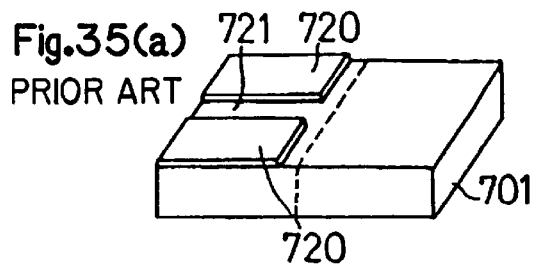
FIGS. 35(a)–35(j) are perspective views and sectional views illustrating process steps in a method for fabricating the structure of FIG. 34.
Figure 35F:
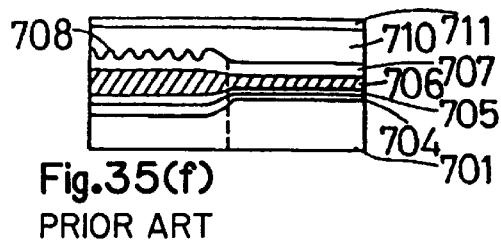
Figure 35B:
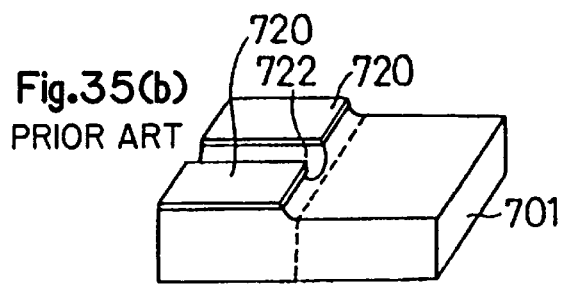
Figure 35G:
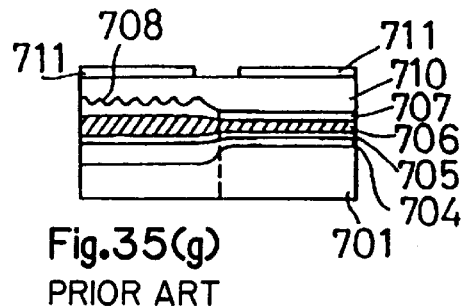
Figure 35C:
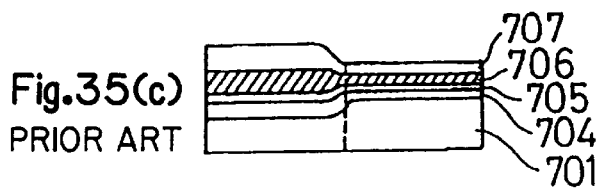
Figure 35H:
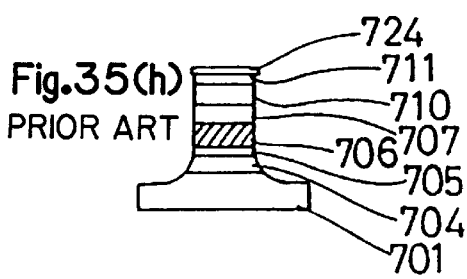
Figure 35D:
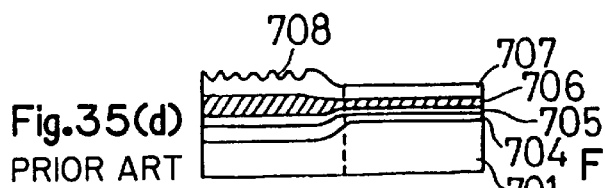
Figure 35I:
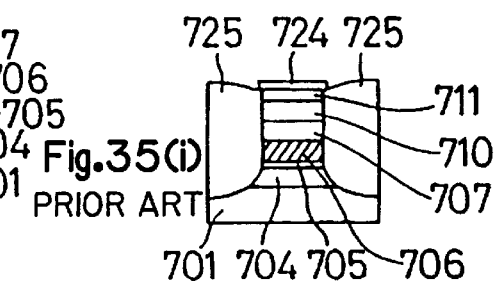
Figure 35E:
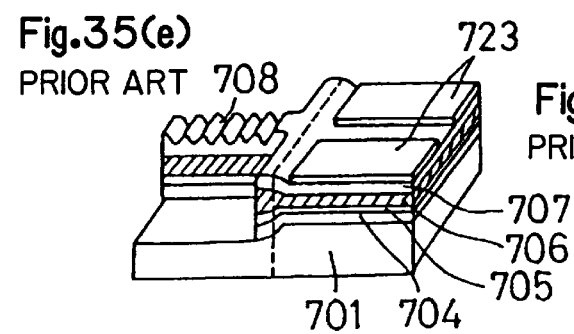
Figure 35J:
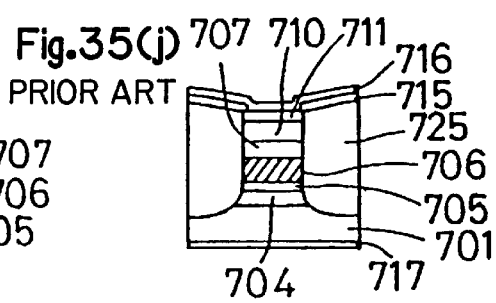

In the prior art integrated semiconductor laser and light modulator shown in FIG. 34, the same effects as in the fourth embodiment, i.e., flat surface before formation of electrodes, reduction of the step at the surface of the grown layers between the modulator region and the LD region, and reduction of the step in the waveguide, are achieved. However, in the prior art device, the selectively grown semiconductor layers 704 to 707, each having a relatively large width, are formed in a narrow stripe-shaped mesa and the mesa is buried in the current blocking layer 725. Therefore, the width of the $SiO_2$ mask 720 for the selective growth must be as large as 100 $\mu$m and the space between the $SiO_2$ masks must be as large as 30 $\mu$m. It is difficult to completely remove the 100 $\mu$m wide $SiO_2$ masks after the selective growth, and the 30 $\mu$m wide space between the masks causes variations in the thickness of the grown layer in the transverse direction of the laser device.

On the other hand, in this fourth embodiment of the present invention, the selective growth of the semiconductor layers constituting the waveguide region is performed so that these layers are planar in the groove that is formed in the lamination of semiconductor layers including the current blocking layer, and the semiconductor layers grown in the groove are used as a waveguide. Therefore, the space between the adjacent $SiO_2$ masks 55 is only 2 $\mu$m, so that the thickness of the layer grown in the groove between the $SiO_2$ masks 55 does not vary in the transverse direction of the laser device. In addition, the 10 $\mu$m wide $SiO_2$ film is sufficient to obtain the effects of the above-described selective etching and selective growth in the narrow region of about 2 $\mu$m. Therefore, polycrystalline material is hardly deposited on the $SiO_2$ film, so that the $SiO_2$ film is easily removed.

Figure 12:
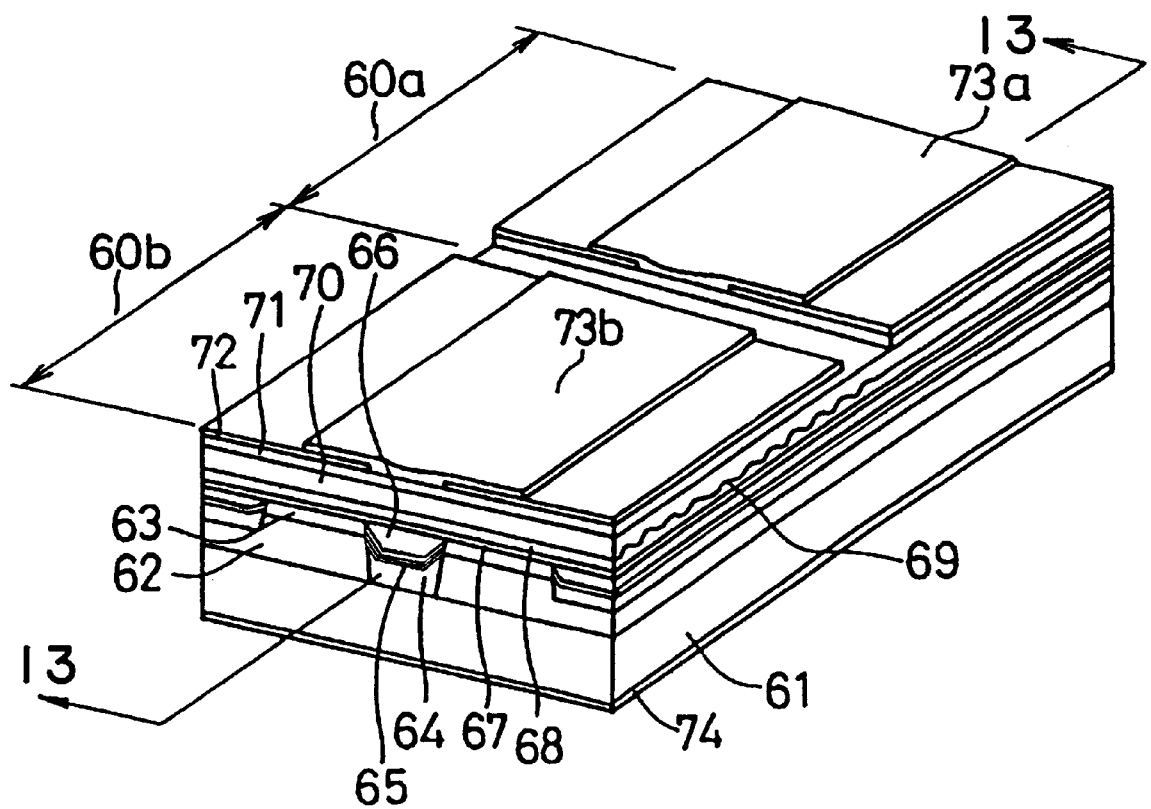
FIG. 12 is a perspective view illustrating an integrated DFB-LD and light modulator in accordance with a fifth embodiment of the present invention.
Figure 13:
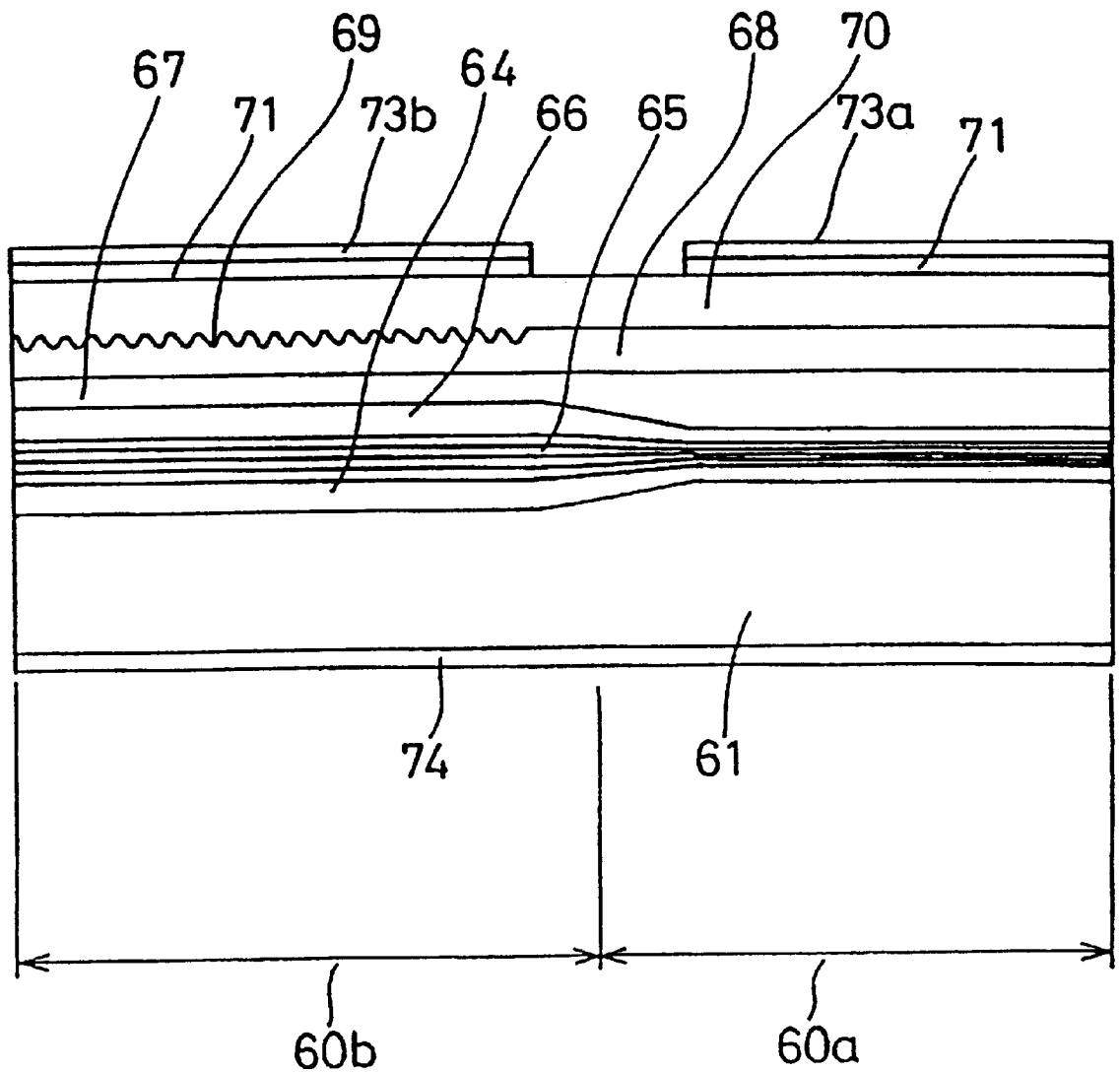
FIG. 13 is a sectional view taken along a line 13—13 of FIG. 12.

FIG. 12 is a perspective view illustrating an integrated DFB-LD and light modulator in accordance with a fifth embodiment of the present invention, and FIG. 13 is a sectional view taken along a line 13—13 of FIG. 12. In FIG. 13, reference numeral 61 designates an n type InP substrate. A light modulator 60a and a DFB-LD 60b are integrated on the substrate 61. An n type InP cladding layer 64 is disposed on the substrate 61. An i type InGaAs/InGaAsP multiple quantum well (MQW) layer 65 is disposed on the cladding layer 64. A p type InP cladding layer 66 is disposed on the MQW layer 65. A p type InP barrier layer 67 is disposed on the cladding layer 66. A p type InGaAsP guide layer 68 including a diffraction grating 69 in the LD region is disposed on the barrier layer 67. A p type InP layer 70 is disposed on the guide layer 68. $P^+$ type InGaAsP contact layers 71 are disposed on the p type InP layer 70 in the LD region and the modulator region, respectively. P side electrodes 73a and 73b of the modulator and the LD, respectively, are disposed on the contact layers 71. An n side electrode 74 common to the LD and the modulator is disposed on the rear surface of the substrate 61. Further, in FIG. 12, reference numeral 62 designates an Fe-doped InP current blocking layer, numeral 63 designates an n type InP layer, and numeral 72 designates an insulating film.

The structure of this fifth embodiment is identical to the structure of the fourth embodiment shown in FIG. 8 except that the diffraction grating is disposed above the MQW layer.

A description is given of the production method.

Initially, an Fe-doped InP current blocking layer 62 and an n type InP layer 63 are grown over the entire surface of the substrate 61. Thereafter, a pair of $SiO_2$ insulating films are formed on the n type InP layer 63 with a 2 $\mu$m wide stripe-shaped region of the layer 63 between them. The thickness of the $SiO_2$ film is about 10 $\mu$m in the LD region and about 4 $\mu$m in the modulator region. Using the $SiO_2$ films as masks, unmasked portions of the semiconductor layers 62 and 63 are selectively etched by vapor phase etching with HCl gas, whereby a stripe-shaped groove penetrating through those layers 62 and 63 and reaching the InP substrate 61 is formed between the $SiO_2$ masks. The etching depth by the vapor phase etching is deeper in the region sandwiched by the 10 $\mu$m wide portions of the $SiO_2$ masks than in the region sandwiched by the 4 $\mu$m wide portions of the masks. Using the $SiO_2$ films as masks for selective growth, an n type InP cladding layer 64, an i type InGaAs/InGaAsP MQW layer 65, and a p type InP cladding layer 66 are grown on the wafer. These layers grown in the stripe-shaped groove between the $SiO_2$ mask are thicker in the region sandwiched by the 10 $\mu$m portions of the masks than in the region sandwiched by the 4 $\mu$m portions of the masks. After removal of the $SiO_2$ masks, a p type InP barrier layer 67 and a p type InGaAsP guide layer 68 are grown over the entire surface of the wafer, and a diffraction grating 69 is formed on the p type InGaAsP guide layer 68 in the LD region. Then, a p type InP layer 70 and a $p^+$ type InGaAsP contact layer 71 are grown over the structure. Finally, a portion of the contact layer 71 opposite the boundary between the LD and the modulator is etched away to electrically separate the LD from the modulator, and an $SiO_2$ insulating film 72 is deposited on the contact layer 71 and patterned to form a window about 2 $\mu$m wide opposite the stripe-shaped groove. To complete the structure of FIG. 12, p side electrodes 73a and 73b for the modulator and the LD, respectively, are formed on the insulating film 72 contacting the contact layer 71 through the window, and a common n side electrode 74 is formed on the rear surface of the substrate 61.

The operating principle of the integrated DFB-LD and light modulator of this fifth embodiment is identical to the operating principle of the device already described with respect to FIGS. 8 and 9, and the same effects as described above are achieved.

Figure 14:
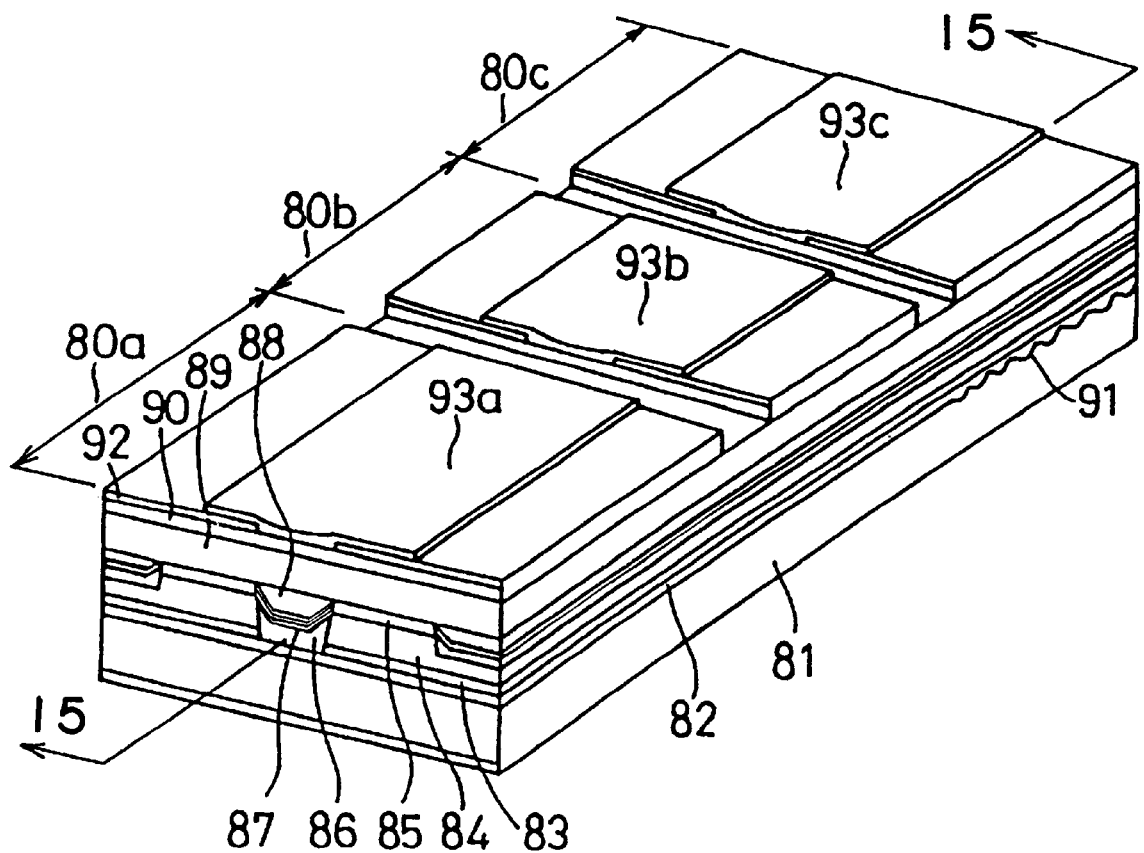
FIG. 14 is a perspective view illustrating a wavelength variable DBR-LD (Distributed Bragg-Reflector Laser Diode) in accordance with a sixth embodiment of the present invention.
Figure 15:
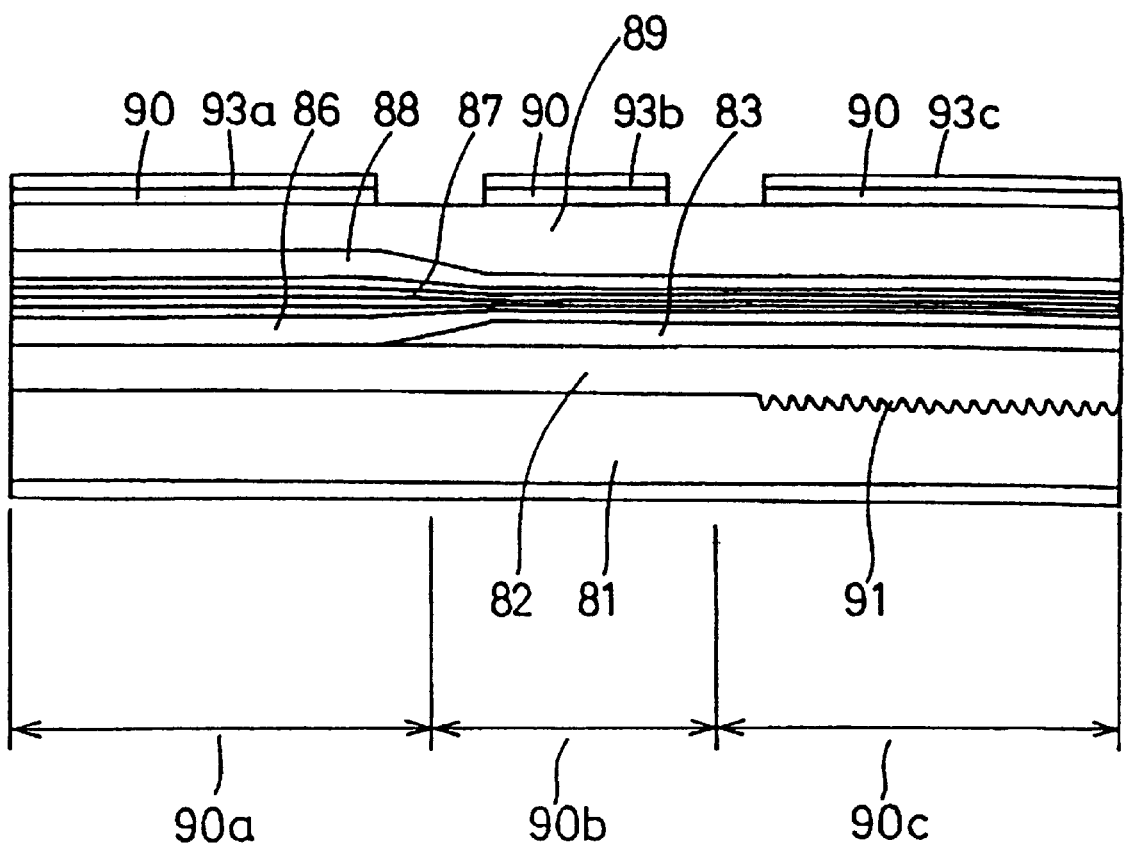
FIG. 15 is a sectional view taken along a line 15—15 of FIG. 14.

While in the above-described second to fifth embodiments an integrated DFB laser and light modulator is described, the present invention may be applied to other semiconductor optical devices or monolithically integrated semiconductor optical devices in which band gap energy of a continuous waveguide should be partially varied. For example, FIG. 14 is a perspective view showing a wavelength tunable DBR-LD (Distributed Bragg-Reflector Laser Diode) fabricated by the same method as described in the fourth embodiment of the present invention. FIG. 15 is a sectional view taken along a line 15—15 of FIG. 14.

In FIG. 15, reference numeral 81 designates an n type InP substrate. An LD 80a, a phase adjustor 80b, and a DBR 80c are integrated on the substrate 81. The substrate 81 includes a diffraction grating 91 in a region where the DBR is located. An n type InGaAsP guide layer 82 is disposed on the substrate 81 including the diffraction grating 91. An n type InP layer 83 is disposed on a part of the guide layer 82 where the phase adjustor 80b and the DBR 80c are located. An n type InP lower cladding layer 86 is disposed on the guide layer 82 and the n type InP layer 83. An i type InGaAs/InGaAsP MQW layer 87 is disposed on the lower cladding layer 86. A p type InP upper cladding layer 88 is disposed on the MQW layer 87. A p type InP layer 89 is. disposed on the upper cladding layer 88. P+ type InGaAsP contact layers 90 are respectively disposed on the p type InP layer 89 in the LD region, the phase adjustor region, and the DBR region. P side electrodes 93a, 93b, and 93c of the LD 80a, phase adjustor 80b, and the DBR 80c, respectively, are disposed on the respective contact layers 90. A common n side electrode 94 is disposed on the rear surface of the substrate 81. Further, in FIG. 14, reference numeral 84 designates an Fe-doped InP current blocking layer, numeral 85 designates an n type InP layer, and numeral 92 designates an insulating layer.

This DBR-LD comprises three elements, i.e., the LD 80a, the phase adjustor 80b, and the DBR 80c, and the electrodes 93a, 93b, and 93c for the respective elements are separated from each other. The structure of this DBR-LD is fundamentally identical to the integrated semiconductor laser and light modulator shown in FIG. 8. The diffraction grating 91 is disposed only in the DBR region, and the SiO₂ mask used for the selective vapor phase etching and the selective crystal growth has a relatively wide portion in the LD region and a relatively narrow portion in the phase adjustor and DBR regions. Thereby, the band gap energy of the waveguide is larger in the phase adjustor and DBR regions than in the LD region. In this case, since light produced in the LD is not absorbed in the phase adjustor and DBR regions, the waveguide loss is reduced. In operation, when current is applied across the DBR 80c, the refractive index of the waveguide changes due to the plasma effect, and laser oscillation occurs at a wavelength determined by the pitch and refractive index of the diffraction grating 91.

Also in this DBR-LD, the same effects as described in the fourth and fifth embodiments are achieved. In addition, the unevenness at the boundary between the LD region and the phase adjustor region is reduced, whereby the light transmission loss is reduced.

The structure and production method of the present invention may be widely applied to other devices, such as an LD with an external resonator, an optical integrated device comprising an LD, a waveguide, a PD (photodiode), an optical amplifier and the like, or a multiwavelength PD device (integrated PDs).

Figure 16:
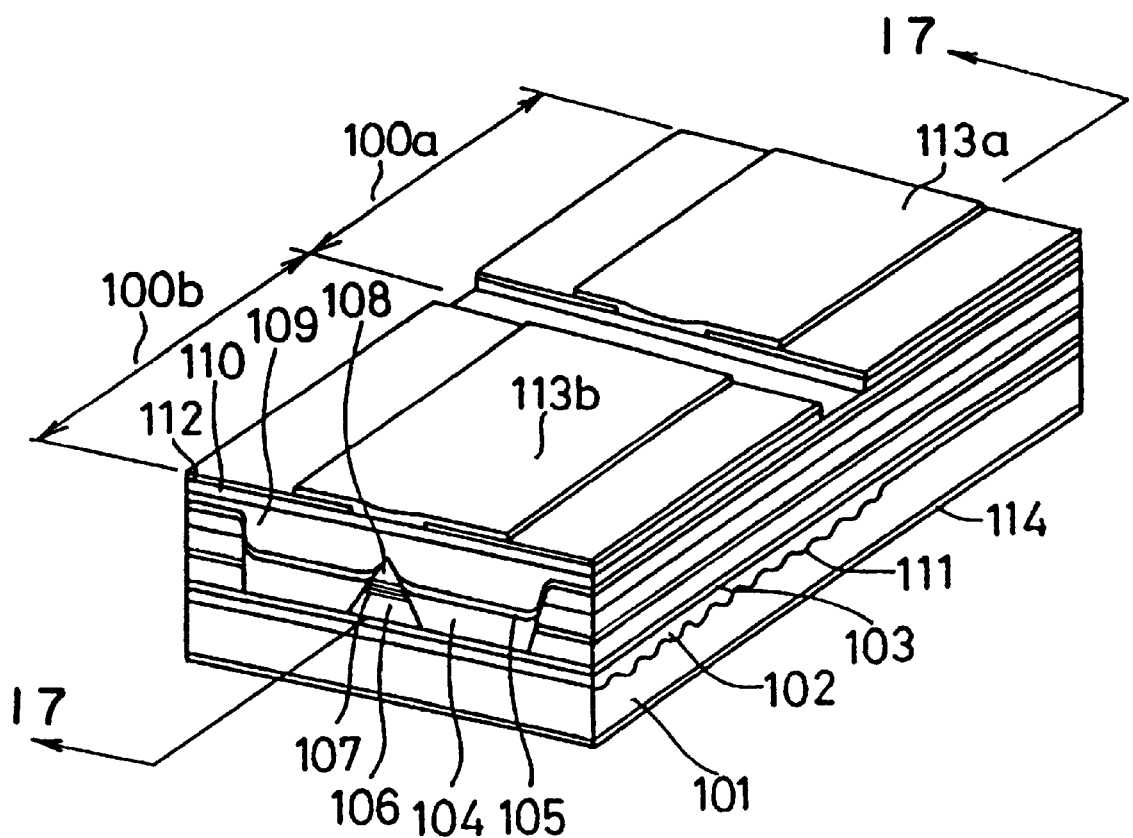
FIG. 16 is a perspective view illustrating an integrated DFB-LD and light modulator in accordance with a seventh embodiment of the present invention.
Figure 17:
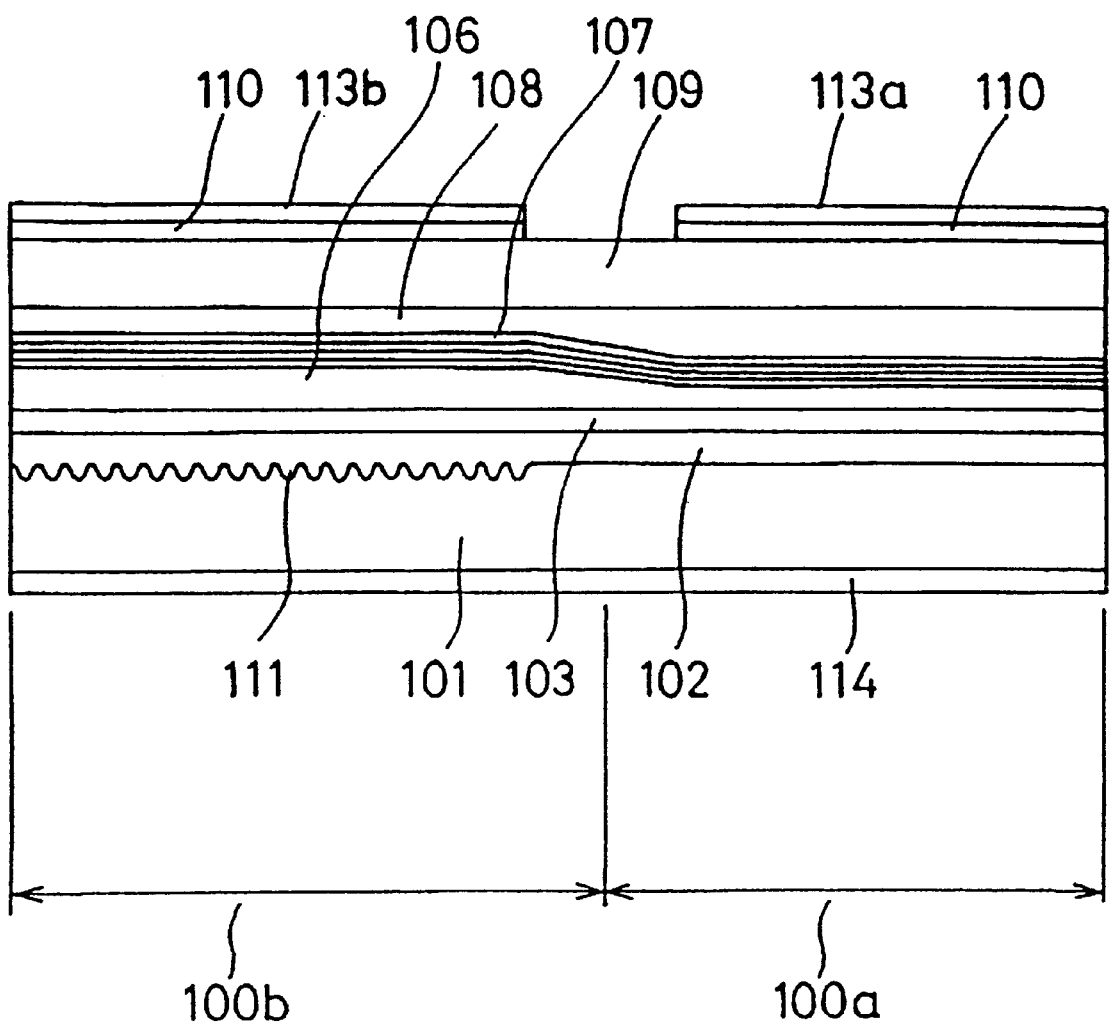
FIG. 17 is a sectional view taken along a line 17—17 of FIG. 16.

FIG. 16 is a perspective view illustrating an integrated semiconductor laser and light modulator in accordance with a seventh embodiment of the present invention, and FIG. 17 is a sectional view taken along a line 17—17 of FIG. 16. In FIG. 17, reference numeral 101 designates an n type InP substrate with a (100) surface orientation. A light modulator 100a and a DFB-LD 100b are integrated on the InP substrate 101. The substrate 101 includes a diffraction grating 111 in a region where the LD 100b is located. An n type InGaAsP guide layer 102 is disposed on the substrate 101 including the diffraction grating 111. An n type InP layer 103 is disposed on the guide layer 102. An n type InP lower cladding layer 106 is disposed on the n type InP layer 103. An i type InGaAs/InGaAsP MQW layer 107 is disposed on the lower cladding layer 106. A p type InP upper cladding layer 108 is disposed on the MQW layer 107. A p type InP layer 109 is. disposed on the upper cladding layer 108. P+ type InGaAsP contact layers 110 are respectively disposed on the p type InP layer 109 in the LD region and the modulator region. P side electrodes 113a and 113b of the modulator and the LD, respectively, are disposed on the respective contact layers 110. A common n side electrode 114 is disposed on the rear surface of the substrate 101. Further, in FIG. 16, reference numeral 104 designates an Fe-doped InP current blocking layer, numeral 105 designates an n type InP layer, and numeral 112 designates an insulating film.

Figure 18A:
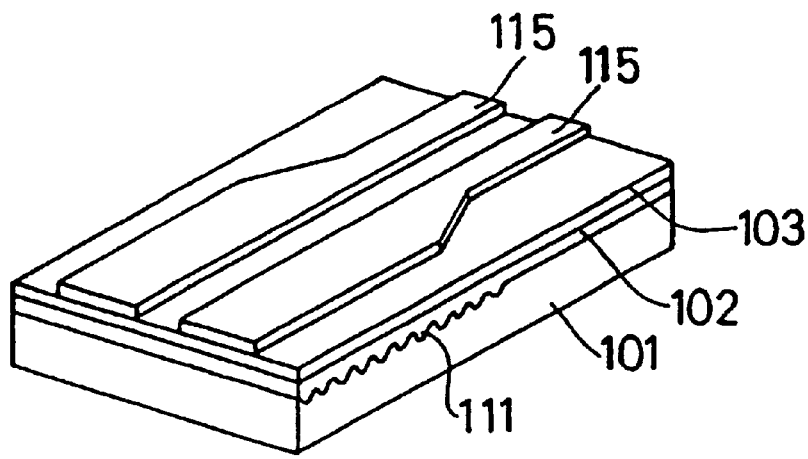
FIGS. 18(a)–18(c) are perspective views illustrating process steps in a method for fabricating the structure of FIG. 16.
Figure 18B:
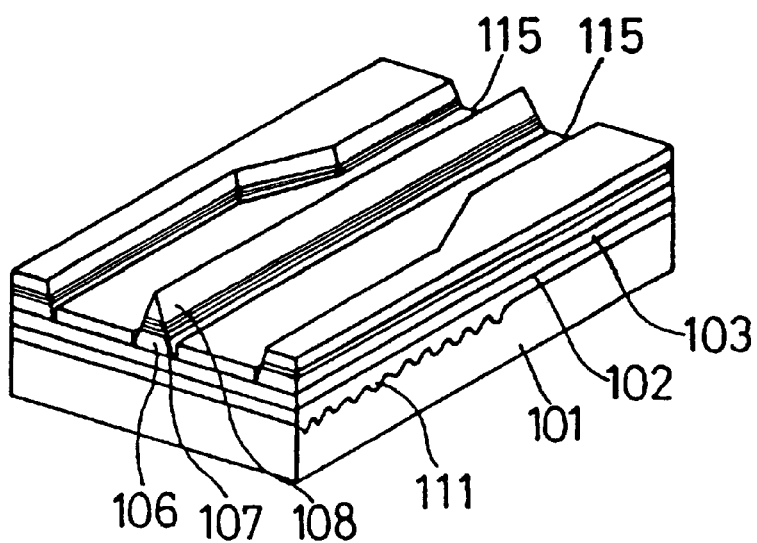
Figure 18C:
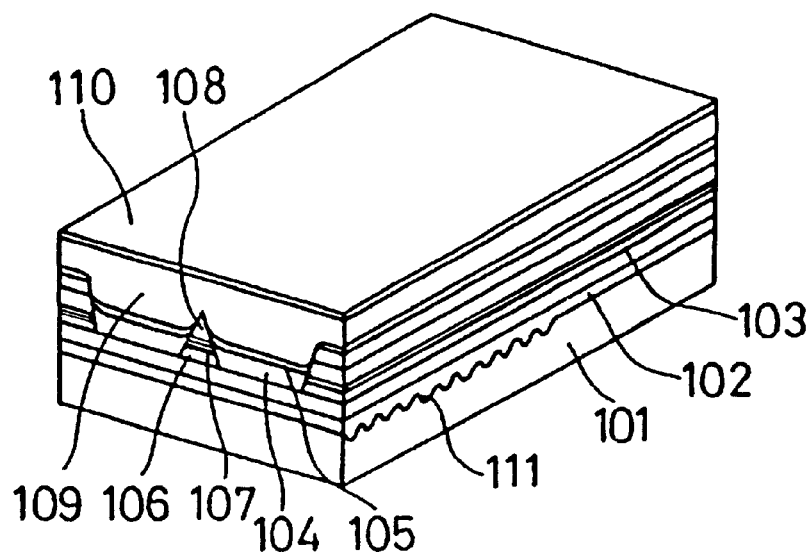

A method for fabricating the structure of FIG. 16 is illustrated in FIGS. 18(a)–18(c).

Initially, a diffraction grating 111 is formed on a part of the (100) surface of the n type InP substrate 101 where an LD is to be located. Then, an n type InGaAsP guide layer 102 and an n type InP layer 103 are successively grown on the surface of the substrate 101 including the diffraction grating 111. Thereafter, as illustrated in FIG. 18(a), a pair of SiO₂ insulating films 115 are formed on the n type InP layer 103. A stripe-shaped region between the SiO₂ films 115 is about 2 μm wide and is aligned along the [011] direction. The width of the SiO₂ insulating film 115 is about 10 μm in the LD region and about 4 μm in the modulator region.

In the step of FIG. 18(b), using the SiO₂ films 115 as masks for selective growth, an n type InP cladding layer 106, an i type InGaAs/InGaAsP MQW layer 107, and a p type InP cladding layer 108 are successively grown on the unmasked regions of the InP layer 103. These layers grown on the stripe region between the SiO₂ masks 115 have a triangular cross section and (111)B side surfaces. The cladding layer 106 and the MQW layer 107 are thicker in the region sandwiched by the relatively wide (about 10 μm) portions of the masks 115 than in the region sandwiched by the relatively narrow (about 4 μm) portions of the masks. However, the growth of the p type InP cladding layer 108 in the region sandwiched by the relatively wide portions of the masks stops when the triangular shape is completed and, thereafter, the growth of the cladding layer 108 proceeds only in the region sandwiched by the relatively narrow portions of the masks 115. Therefore, the stripe-shaped triangular ridge produced between the SiO₂ masks 115 has a uniform height.

After removal of the SiO₂ films 115, an Fe-doped InP layer 104, an n type InP layer 105, a p type InP layer 109, and a p+ type InGaAsP contact layer 110 are grown over the entire surface (FIG. 18(c)). Since no crystal growth occurs on the (111)B planes of the stripe-shaped ridge, these layers are grown from the flat surface of the InP layer 103 that is exposed by the removal of the SiO₂ films 115, and the ridge structure is buried in these layers. The p type InP cladding layer 108 is united with the p type InP layer 109. As a result, current is concentrated in the stripe region where the insulating Fe-doped InP layer 104 is absent.

Thereafter, a portion of the contact layer 110 opposite the boundary between the LD and the modulator is etched away to separate the LD from the modulator, followed by deposition of an SiO₂ insulating film 112. Two windows, each having a width of about 2 μm, are formed in the SiO₂ insulating film 112 opposite the LD region and the modulator region, respectively. To complete the structure of FIG. 16, p side electrodes 113a and 113b for the modulator and the LD, respectively, are formed on the insulating film 112 contacting the contact layer 110 through the windows, and a common n side electrode 114 is formed on the rear surface of the substrate.

In this seventh embodiment of the present invention, the finally grown layer 109 has a flat surface. The flat surface facilitates processing after the crystal growth, i.e., the formation of the windows in the SiO$_2$ film and the patterning of the p side electrodes, whereby reproducibility and production yield are improved.

Figure 19:
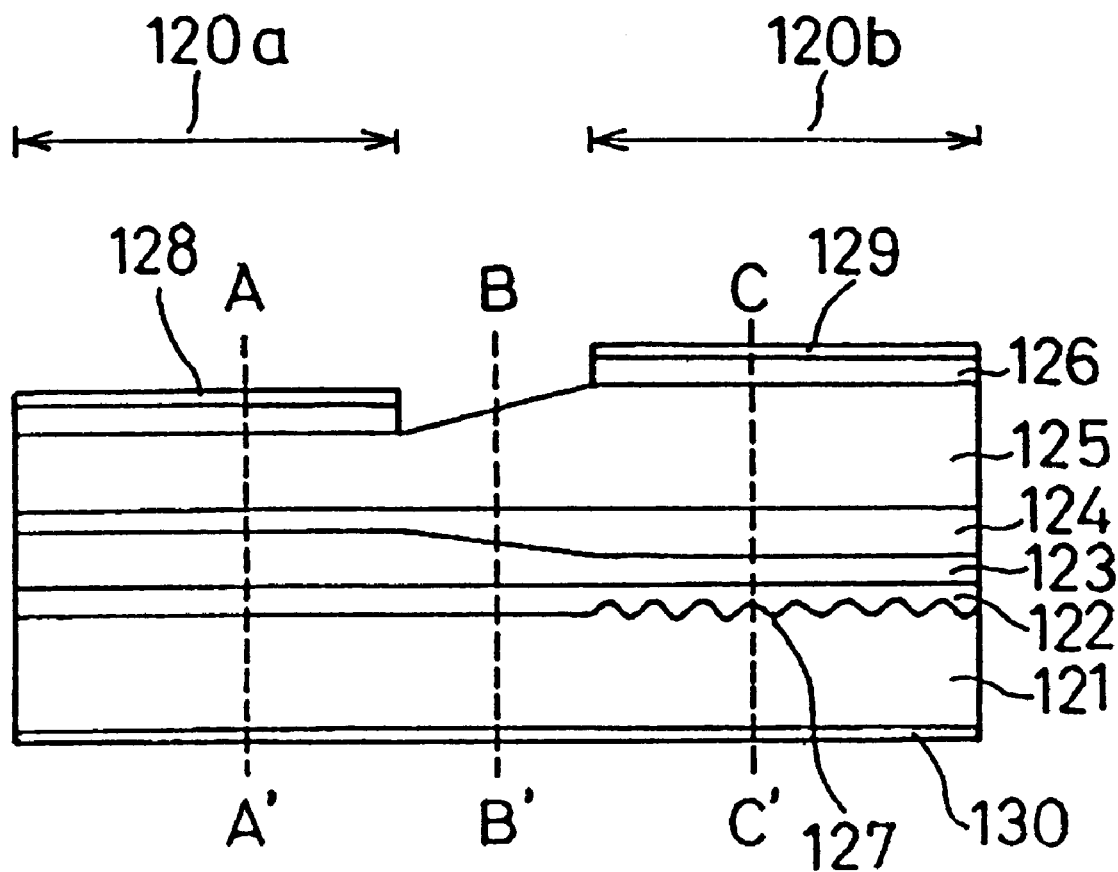
FIG. 19 is a sectional view illustrating an integrated DFB-LD and light modulator in accordance with an eighth embodiment of the present invention.

FIG. 19 is a sectional view illustrating an integrated semiconductor laser and light modulator in accordance with an eighth embodiment of the present invention. In the figure, reference numeral 121 designates an n type InP. substrate. A light modulator 120a and a laser diode 120b are integrated on the substrate 121. A diffraction grating 127 is disposed on a part of the substrate 121 where the LD 120b is located. An n type InGaAsP guide layer 122 is disposed on the substrate 121 including the diffraction grating 127. An In$_{1-x'}$Ga$_{x'}$As$_y$P$_{1-y}$/In$_{1-x'}$Ga$_{x'}$As$_y$P$_{1-y'}$ MQW light absorption layer 123 is disposed on the guide layer 122. An In$_{1-x}$"Ga$_x$"As/In$_{1-x'}$Ga$_{x'}$As$_y$P$_{1-y'}$ MQW active layer 124 is disposed on the light absorption layer 123. The thickness and the number of the well layer included in the MQW light absorption layer 123 are different from those of the well layer included in the MQW active layer 124. A p type InP cladding layer 125 is disposed on the active layer 124. P type InGaAsP cap layers 126a and 126b are disposed on the cladding layer 125 in the modulator region and the LD region, respectively. P side electrodes 128 and 129 are disposed on the cap layers 126a and 126b, respectively. A common n side electrode 130 is disposed on the rear surface of the substrate 121. Preferably, the composition ratio of the In$_{1-x}$Ga$_x$As$_y$P$_{1-y}$ is In$_{0.57}$Ga$_{0.43}$As$_{0.93}$P$_{0.07}$, the composition ratio of the In$_{1-x'}$Ga$_{x'}$As$_y$P$_{1-y'}$ is In$_{0.76}$Ga$_{0.24}$As$_{0.55}$P$_{0.45}$, and the composition ratio of the In$_{1-x"}$Ga$_{x"}$As is In$_{0.53}$Ga$_{0.47}$As.

A method for fabricating the structure of FIG. 19 is illustrated in FIGS. 20(a)–20(d).

Figure 20A:
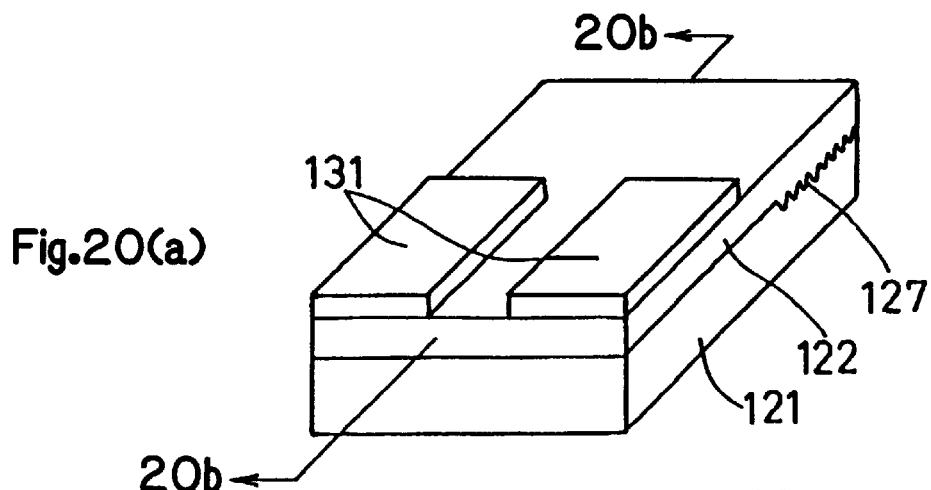
FIGS. 20(a)–20(d) are perspective views and sectional views illustrating process steps in a method for fabricating the structure of FIG. 19.

Initially, a diffraction grating 127 is formed on a portion of the n type InP substrate 121 where an LD is to be located, and an n type InGaAsP guide layer 122 is grown on the substrate 121 including the diffraction grating 127. As illustrated in FIG. 20(a), a pair of SiO$_2$ masks 131 is formed on a portion of the guide layer 122 where a modulator is to be located with a stripe-shaped region about 200 μm wide between them. Each SiO$_2$ mask 131 is about 200 μm×400 μm in size.

Figure 20B:
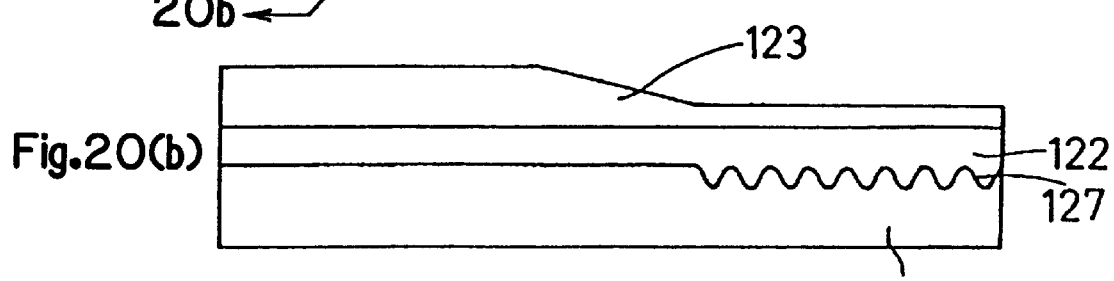

Thereafter, an In$_{1-x}$Ga$_x$As$_y$P$_{1-y}$/In$_{1-x'}$Ga$_{x'}$As$_y$P$_{1-y'}$ MQW light absorption layer 123 is grown over the wafer by MOCVD. FIG. 20(b) illustrates a sectional view taken along a line 20b—20b of FIG. 20(a). As shown in FIG. 20(b), the MQW light absorption layer 123 is thicker in the region sandwiched by the masks 131 (the modulator region) than in the region where the masks are absent. In the MQW light absorption layer 123 grown in the modulator region sandwiched by the masks 131, the thickness of the well layers should be 8 nm. In the MQW layer 123 grown in the LD region where the masks 131 are absent, the well layers are thinner than in the modulator region. For example, they are about 5 nm thick. In addition, the MQW layer includes ten well layers.

Figure 20C:
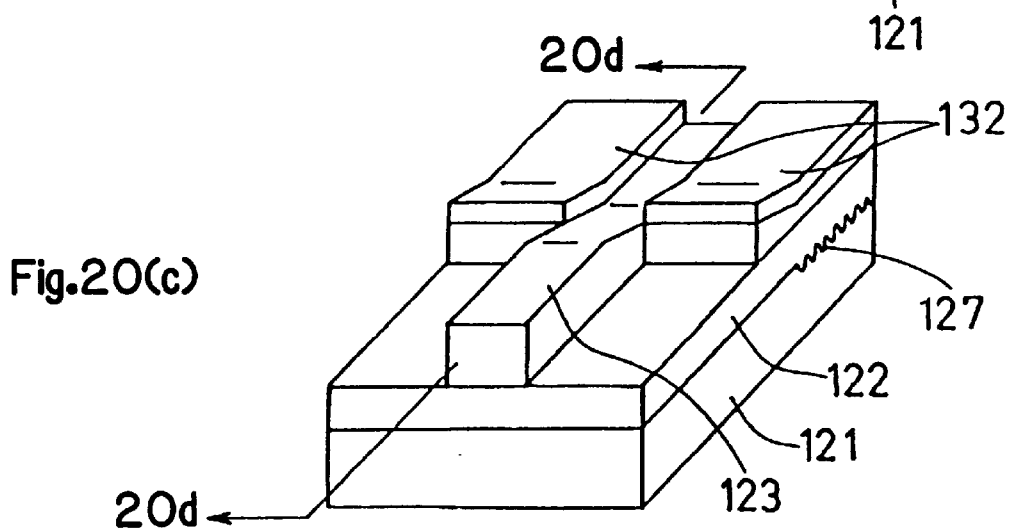

After removal of the SiO$_2$ masks 131, SiO$_2$ masks 132 are formed in the LD region as shown in FIG. 20(c).

Figure 20D:
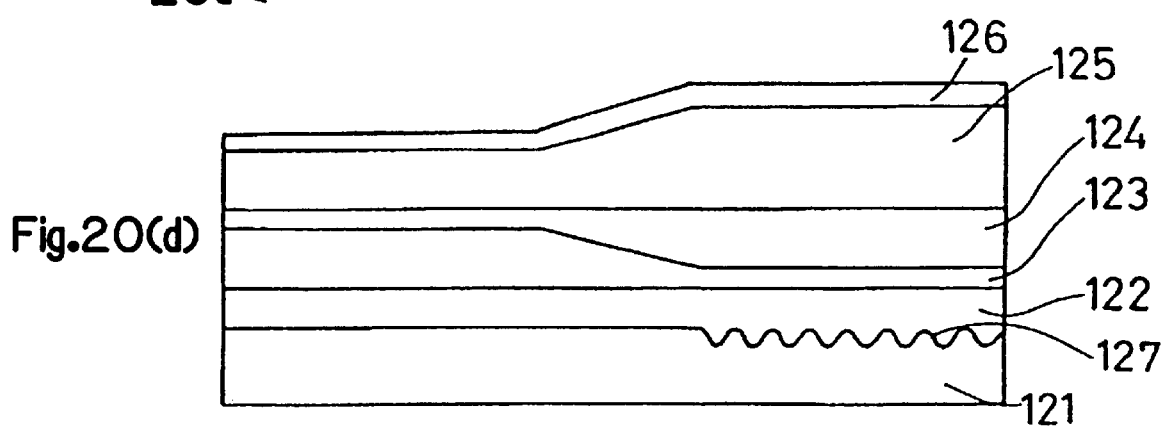

Thereafter, an In$_{1-x}$Ga$_x$As/In$_{1-x'}$Ga$_{x'}$As$_y$P$_{1-y'}$ MQW active layer 124, a p type InP cladding layer 125, and a p type InGaAsP cap layer 126 are grown over the wafer shown in FIG. 20(c) by MOCVD. FIG. 20(d) shows a sectional view taken along a line 20d—20d of FIG. 20(c). If the thickness of the well layer included in the MQW active layer 124 grown in the LD region where the masks 132 are present is 7 nm, the thickness of the well layer in the modulator region where the masks 132 are absent is about 4 nm. In addition, the MQW active layer 124 includes five well layers.

Figure 22A:
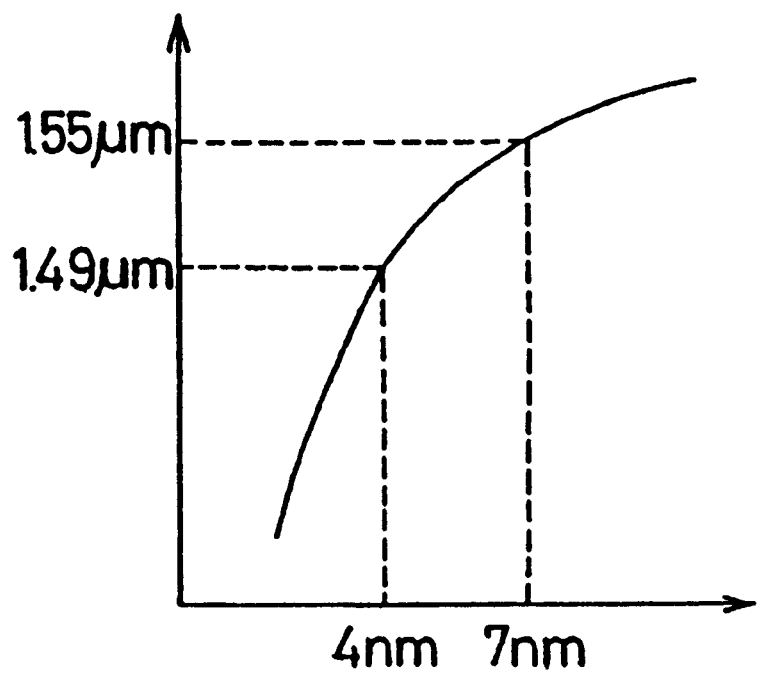
FIGS. 22(a) and 22(b) are graphs illustrating band gap wavelength vs. well layer thickness characteristics of an active layer and a light absorption layer, respectively, included in the device shown in FIG. 19.
Figure 22B:
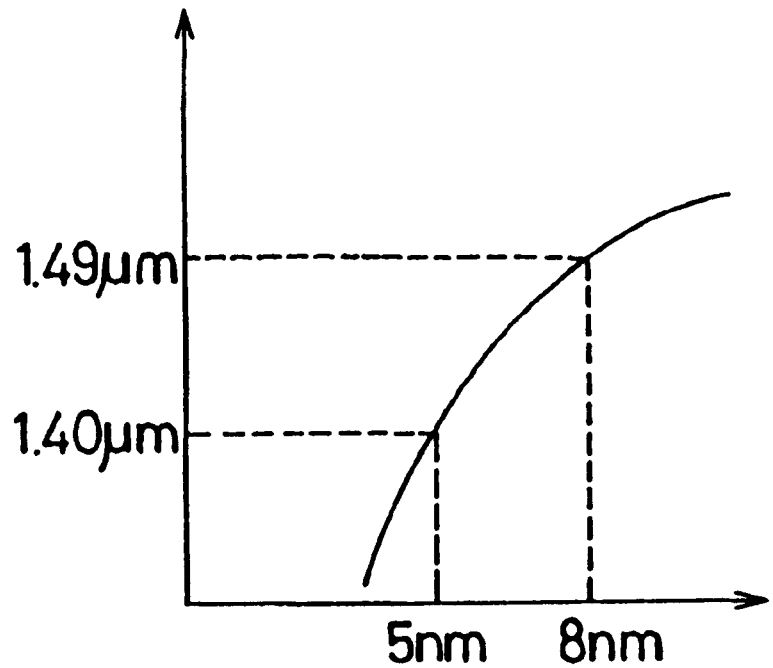
Figure 23:
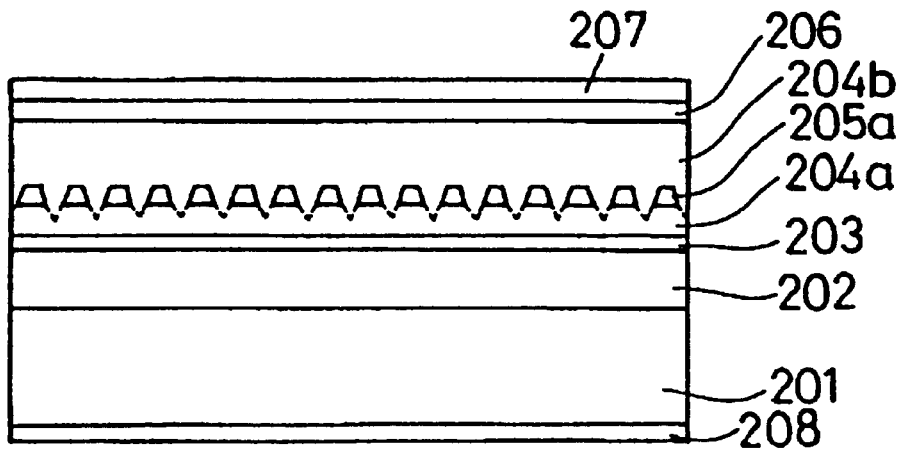
FIG. 23 is a perspective view illustrating a DFB. semiconductor laser according to the prior art.
Figure 24A:
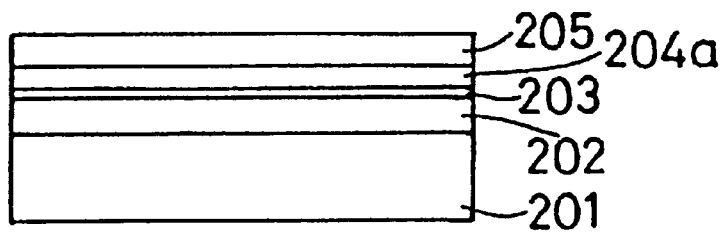
FIGS. 24(a)–24(c) are sectional views illustrating process steps in a method for fabricating the semiconductor laser of FIG. 23.
Figure 24B:
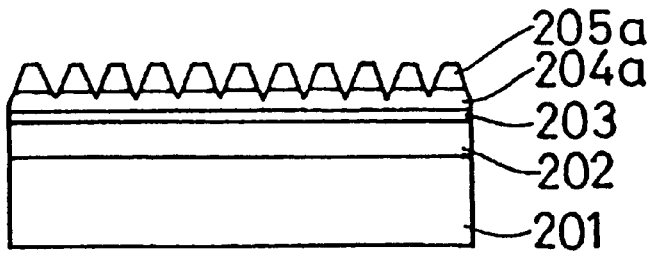
Figure 24C:
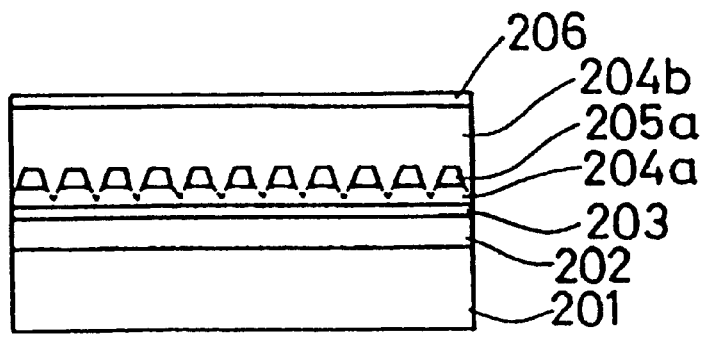

A description is given of the operation. As shown in FIG. 22(a), when the In$_{1-x"}$Ga$_{x"}$As/In$_{1-x'}$Ga$_{x'}$As$_y$P$_{1-y'}$ MQW active layer 124 in the LD region has a well layer thickness of 7 nm and an effective band gap wavelength $\lambda_{g4}$ of 1.55 μm, the MQW active layer 124 in the modulator region has a well layer thickness of about 4 nm and an effective band gap wavelength $\lambda_{g3}$ of about 1.49 μm which corresponds to a band gap energy larger than that in the LD region. As shown in FIG. 22(b), if the effective band gap wavelength ($\lambda_g$) of the In$_{1-x}$Ga$_x$As$_y$P$_{1-y}$/In$_{1-x'}$Ga$_{x'}$As$_y$P$_{1-y'}$ MQW light absorption layer 123 in the modulator region (8 nm thick well layer) is 1.49 μm ($\lambda_{g1}$), the effective band gap wavelength of the light absorption layer 123 in the LD region (5 nm thick well layer) is about 1.40 μm ($\lambda_{g2}$). The guided light is distributed in the active layer 124 and the light absorption layer 123 and confined in the respective layers. The oscillation wavelength of the LD (=$\lambda_{g4}$=1.55 μm) is not absorbed in the modulator region because the band gap energy in the modulator region is larger than that in the LD region, i.e., $\lambda_{g3}$=$\lambda_{g2}$=1.49 μm, so that it passes through the modulator region and is emitted from the facet. When a reverse bias is applied to the modulator, the absorption edge is shifted toward the long wavelength side due to the quantum confinement Stark effect, and the effective band gap is reduced, whereby the laser light ($\lambda$=1.55 μm) is absorbed by the modulator.

In the integrated semiconductor laser and light modulator according to the eighth embodiment of the present invention, since the active layer and the light absorption layer are different layers, it is possible to optimize the thickness and number of the well layers for each of the active layer and the light absorption layer individually. In this embodiment, the well layers included in the MQW light absorption layer of the modulator are as thick as 8 nm so that the shift of the absorption edge when an electric field is applied is increased to increase the extinction ratio. The MQW light absorption layer includes about ten well layers so that the light confinement coefficient is increased to increase the extinction ratio. Since the optimum design is possible, characteristics of the light modulator, such as the extinction ratio, are significantly improved while maintaining good characteristics of the LD, compared to the above-described integrated semiconductor laser and light modulator in which one MQW layer serves both as the active layer and the light absorption layer.

Figure 21:
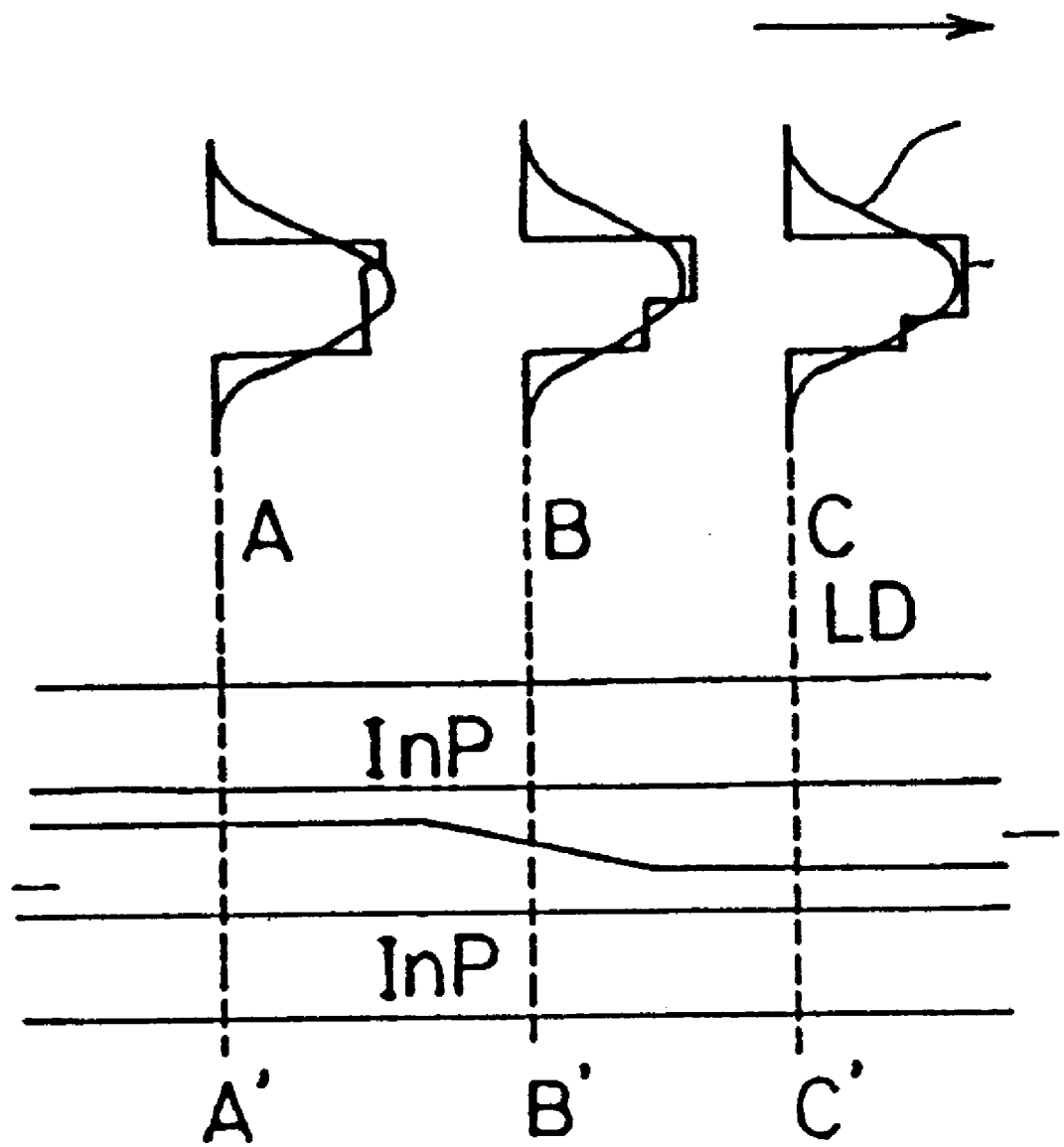
FIG. 21 is a diagram illustrating refractive index distributions and light intensity distributions in a direction perpendicular to a light guide structure of the device shown in FIG. 19.

Furthermore, in this eighth embodiment, a reduction in the optical coupling efficiency due to scattering of light at the boundary between the LD and the modulator, that has been a serious problem in a structure including two different layers as the active layer and the light absorption layer, is avoided. The reason will be described in the following. FIG. 21 illustrates refractive index distributions and light intensity distributions in a direction perpendicular to the respective layers at positions indicated by A–A' (LD region), B–B' (boundary region), and C–C' (modulator region) in FIG. 19. The guided light is dispersed and confined in the active layer 124 and the light absorption layer 123 which have refractive indices larger than that of the InP cladding layer. Although the refractive index of the active layer (refractive index of the LD region) is different from the refractive index of the light absorption layer (refractive index of the modulator region), the difference is negligible because these layers are similar in composition and structure.

In the boundary region, the thicknesses of the active layer and the light absorption layer gradually vary, so that the refractive index gradually varies from the value (distribution) in the LD region to the value (distribution) in the modulator region. Since the difference in the refractive indices between the LD region and the modulator region is small, and the refractive index gradually varies in the boundary region where the width (50~100 $\mu$m) is larger than the thickness (~0.3 $\mu$m), the variation is very slow. As a result, the light intensity distribution in the direction perpendicular to those layers varies slowly from the LD region to the modulator region, and light is not scattered but smoothly guided, whereby the optical coupling efficiency between the LD and the modulator is improved.

While in the above-described eighth embodiment an integrated semiconductor laser and light modulator is described, the idea of the present invention may be applied to other integrated optical devices, such as an integrated LD and optical waveguide or an integrated LD and optical switch, or other optical devices, such as a wavelength variable DBR-LD. Also in these cases, the same effects as described above are achieved.

What is claimed is:

1. An optical semiconductor device in which a plurality of elements are integrated on a semiconductor substrate fabricated by a method comprising:

preparing a semiconductor wafer having a {100} oriented surface;

forming a pair of masks on the surface of the wafer defining a stripe-shaped region of the wafer extending in a direction between the masks, each mask having portions of different widths corresponding to the respective elements, the stripe-shaped region having a uniform width between the masks and transverse to the direction;

using the masks, selectively growing a cladding layer of a first conductivity type, a multiple quantum well layer, and a cladding layer of a second conductivity type, opposite the first conductivity type, on the wafer, forming a stripe-shaped mesa having a triangular cross section in the stripe-shaped region between the masks;

removing the masks;

after removal of the masks, growing a current blocking layer burying the stripe-shaped mesa, leaving a top portion of the mesa exposed; and growing a semiconductor layer of the second conductivity type completely burying the mesa and having a planar surface.

2. The semiconductor optical device of claim 1 wherein a diffraction grating is formed in the region where the laser diode is to be located before forming the multiple quantum well layer.

3. The semiconductor optical device of claim 1 comprising a semiconductor laser diode and a light modulator for modulating laser light produced by the laser diode and integrated on the semiconductor wafer wherein the masks for the selective growth are wider in a region where the semiconductor laser diode is to be located than in a region where the light modulator is to be located.

4. A semiconductor optical device including:

a single semiconductor substrate having a {100} oriented surface;

a semiconductor laser diode producing laser light and a light modulator for modulating the laser light, the laser diode and the light modulator being integrated on the single semiconductor substrate and including a stripe-shaped ridge structure on the {100} oriented surface of the semiconductor substrate, the ridge structure having a length extending in the direction, a triangular cross section transverse to the {100} oriented surface of the semiconductor substrate and the length, and a uniform width, along the length, transverse to the direction, and B side surfaces, the stripe-shaped ridge structure comprising a lower cladding layer of a first conductivity type, a multiple quantum well layer, and an upper cladding layer of a second conductivity type, opposite the first conductivity type, wherein the multiple quantum well layer has different thicknesses in regions where the laser diode and the light modulator are located; and current blocking layers located on portions of the {100} oriented surface of the semiconductor substrate where the stripe-shaped ridge structure is absent, burying the stripe-shaped ridge structure except for an exposed top portion of the ridge.

5. The semiconductor optical device of claim 4 wherein the width of the triangular ridge structure at the {100} oriented surface of the semiconductor substrate does not exceed 5 $\mu$m.

* * * * *